United States Patent
Jiang et al.

(10) Patent No.: US 12,035,587 B2
(45) Date of Patent: Jul. 9, 2024

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Xiaofeng Jiang, Beijing (CN); Linhong Han, Beijing (CN); Huijuan Yang, Beijing (CN); Huijun Li, Beijing (CN); Xin Zhang, Beijing (CN); Meng Zhang, Beijing (CN); Lulu Yang, Beijing (CN); Jie Dai, Beijing (CN); Lu Bai, Beijing (CN); Siyu Wang, Beijing (CN); Yu Wang, Beijing (CN); Yupeng He, Beijing (CN); Yi Qu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 421 days.

(21) Appl. No.: 17/432,202

(22) PCT Filed: Mar. 13, 2020

(86) PCT No.: PCT/CN2020/079229
§ 371 (c)(1),
(2) Date: Aug. 19, 2021

(87) PCT Pub. No.: WO2021/179291
PCT Pub. Date: Sep. 16, 2021

(65) Prior Publication Data
US 2022/0344449 A1 Oct. 27, 2022

(51) Int. Cl.
*H10K 59/131* (2023.01)

(52) U.S. Cl.
CPC .................. *H10K 59/131* (2023.02)

(58) Field of Classification Search
CPC .......... G02F 1/1345; G09G 2300/0223; G09G 2300/0426; H10K 59/131
See application file for complete search history.

(56) References Cited

U.S. PATENT DOCUMENTS

| 10,012,882 B2 | 7/2018 | Liao et al. |
| 2007/0002243 A1 | 1/2007 | Kim |

(Continued)

FOREIGN PATENT DOCUMENTS

| CN | 101510383 A | 8/2009 |
| CN | 103337233 A | 10/2013 |

(Continued)

OTHER PUBLICATIONS

Extended European Search Report in European Patent Application No. 20924749.3 dated Mar. 28, 2023.

(Continued)

*Primary Examiner* — Daniel P Shook
(74) *Attorney, Agent, or Firm* — Collard & Roe, P.C.; William Collard

(57) ABSTRACT

A display panel and a display device are provided. The display panel includes: a display part including a plurality of data lines; a fan-out part including a plurality of fan-out lines; and a lead wire part including a plurality of first lead wires which are respectively connected with the plurality of data lines through the plurality of fan-out lines, and the plurality of fan-out lines are fanned out between the lead wire part and the display part. The plurality of first lead wires each include a first lead wire subpart and a compensation part to form a plurality of first lead wire subparts and a plurality of compensation parts, the plurality of first lead wire subparts are respectively connected with the plurality (Continued)

of compensation parts; the first lead subparts (WS1) have a width different from that of the compensation parts.

20 Claims, 13 Drawing Sheets

(56) References Cited

U.S. PATENT DOCUMENTS

| | | | |
|---|---|---|---|
| 2007/0195254 A1 | 8/2007 | Lee et al. | |
| 2015/0294988 A1 | 10/2015 | Hsieh et al. | |
| 2018/0197484 A1 | 7/2018 | Moon et al. | |
| 2018/0337226 A1 | 11/2018 | Liu et al. | |
| 2020/0006460 A1 | 1/2020 | Chen | |

FOREIGN PATENT DOCUMENTS

| | | | | | |
|---|---|---|---|---|---|
| CN | 103886844 A | | 6/2014 | | |
| CN | 104503171 A | | 4/2015 | | |
| CN | 107490885 A | | 12/2017 | | |
| CN | 109493786 A | | 3/2019 | | |
| KR | 10-2004-0107744 A | | 12/2004 | | |
| KR | 20040107744 A | * | 12/2004 | ......... | G02F 1/13452 |

OTHER PUBLICATIONS

International Search Report of PCT/CN2020/079229 in Chinese, mailed Dec. 10, 2020 with English translation.
Notice of Transmittal of the International Search Report of PCT/CN2020/079229 in Chinese, mailed Dec. 10, 2020.
Written Opinion of the International Searching Authority of PCT/CN2020/079229 in Chinese, mailed Dec. 10, 2020.
Extended European Search Report in European Patent Application No. 20924749.3 dated Jul. 7, 2023.

* cited by examiner

DISPLAY PANEL AND DISPLAY DEVICE

CROSS REFERENCE TO RELATED APPLICATIONS

This application is the National Stage of PCT/CN2020/079229 filed on Mar. 13, 2020, the disclosure of which is incorporated by reference.

TECHNICAL FIELD

Embodiments of the disclosure relate to a display panel and a display device.

BACKGROUND

With the rapid development of active-matrix organic light-emitting diodes (AMOLEDs) in the field of display, the improvement of yield is extremely urgent.

SUMMARY

Embodiments of the disclosure provide a display panel and a display device.

At least one embodiment of the disclosure provides a display panel, comprising: a display part comprising a plurality of data lines and a plurality of subpixels, the plurality of data lines being electrically connected with the plurality of subpixels and being configured to provide the plurality of subpixels with data signals; a fan-out part comprising a plurality of fan-out lines, at least a part of which have an extension direction different from that of the data lines; and a lead wire part comprising a plurality of first lead wires which are respectively connected with the plurality of data lines through the plurality of fan-out lines, the plurality of fan-out lines being fanned out between the lead wire part and the display part, the first lead wires having an extension direction the same as that of the data lines, and adjacent data lines of the plurality of data lines having a distance greater than that between adjacent first lead wires of the plurality of first lead wires; wherein the plurality of first lead wires each comprise a first lead wire subpart and a compensation part to form a plurality of first lead wire subparts and a plurality of compensation parts, the plurality of first lead wire subparts are respectively connected with the plurality of compensation parts; in a plan view of the display panel, the first lead subparts have a width different from that of the compensation parts in a direction perpendicular to the extension direction of the first lead wires.

In one or more embodiments of the disclosure, an included angle between at least one of the plurality of data lines and at least one of the plurality of fan-out lines is an obtuse angle.

In one or more embodiments of the disclosure, the first lead wire subparts are closer to the fan-out part than the compensation parts, and the first lead wire subparts have a width smaller than that of the compensation parts.

In one or more embodiments of the disclosure, adjacent compensation parts have the same width.

In one or more embodiments of the disclosure, adjacent compensation parts have different lengths in the extension direction of the first lead wires.

In one or more embodiments of the disclosure, the plurality of compensation parts have their respective lengths changing gradually in an arrangement direction of the plurality of first lead wires.

In one or more embodiments of the disclosure, a number of the plurality of first lead wires is n, the longest compensation part of the plurality of compensation parts has a length of H, and the plurality of compensation parts have a gradual change amount of length of Δ (H/n).

In one or more embodiments of the disclosure, the display panel has a center line which has an extension direction the same as that of the first lead wires, and the plurality of compensation parts have their respective lengths decreasing gradually in a direction from edges of the display panel to the center line.

In one or more embodiments of the disclosure, the display panel has a center line which has an extension direction the same as that of the first lead wires, and the plurality of compensation parts have their respective lengths decreasing gradually and then increasing gradually in a direction from edges of the display panel to the center line.

In one or more embodiments of the disclosure, the plurality of compensation parts have the same length in the extension direction of the first lead wires, and have their respective widths changing gradually.

In one or more embodiments of the disclosure, the plurality of compensation parts have their respective lengths in the extension direction of the first lead wires changing gradually, and have their respective widths changing gradually.

In one or more embodiments of the disclosure, the first lead wires further comprise second lead wire subparts connected with the compensation parts, and the second lead wire subparts have a width smaller than that of the compensation parts and are located on a side of the compensation parts away from the display part.

In one or more embodiments of the disclosure, the display panel further comprises a plurality of second lead wires which have the same width everywhere.

In one or more embodiments of the disclosure, the display panel further comprises a connection pad part which is configured to be connected with an external circuit, wherein the connection pad part comprises a plurality of connection pads and is located on a side of the lead wire part away from the fan-out part, and the plurality of connection pads are electrically connected with the plurality of first lead wires.

In one or more embodiments of the disclosure, a plurality of lead wire parts are provided, which are arranged symmetrically relative to the center line of the display panel.

In one or more embodiments of the disclosure, the plurality of lead wire parts comprise a first lead wire part and a second lead wire part, and a plurality of compensation parts of the first lead wire part have a total area different from that of a plurality of compensation parts of the second lead wire part.

In one or more embodiments of the disclosure, the lead wire parts have their respective total areas of compensation parts increasing gradually in the direction from the edges of the display panel to the center line.

In one or more embodiments of the disclosure, the plurality of compensation parts of the lead wire part close to the center line have a larger total area than the plurality of compensation parts of the lead wire part away from the center line, in the direction from the edges of the display panel to the center line.

In one or more embodiments of the disclosure, between adjacent lead wire parts there is an interval whose width is larger than a distance between adjacent first lead wires of the respective lead wire parts.

In one or more embodiments of the disclosure, the display panel further comprises a first power bus which is located on a side of the display part and at least partly overlaps with the plurality of fan-out lines, wherein the first power bus comprises a first portion, a second portion and a connection line, the connection line connects the first portion and the second portion and overlaps with the interval.

In one or more embodiments of the disclosure, the second portion of the first power bus is located on a side of the first portion of the first power bus away from the display part.

In one or more embodiments of the disclosure, the display panel further comprises a plurality of first power lines extending from the first power bus, wherein the plurality of first power lines extend to the display part and are configured to provide the plurality of subpixels with first power signals.

In one or more embodiments of the disclosure, the display panel further comprises a second power signal line surrounding the display part, wherein at least a part of the second power signal line overlaps with the interval, and the second power signal line is configured to provide the plurality of subpixels with second power signals.

In one or more embodiments of the disclosure, the plurality of fan-out lines comprise a plurality of first fan-out lines and a plurality of second fan-out lines arranged alternately, which are located on different layers; the plurality of first lead wires comprise a plurality of first lead wires of first type and a plurality of first lead wires of second type arranged alternately; the plurality of first lead wires of first type are respectively connected with the plurality of first fan-out lines and are located on the same layer as the plurality of first fan-out lines; and the plurality of first lead wires of second type are respectively connected with the plurality of second fan-out lines and are located on the same layer as the plurality of second fan-out lines.

In one or more embodiments of the disclosure, at least one of the plurality of subpixels comprises a thin film transistor and a storage capacitor; the thin film transistor comprises an active layer located on a base substrate, a first gate insulation layer located on a side of the active layer away from the base substrate, a gate electrode located on a side of the first gate insulation layer away from the base substrate, a second gate insulation layer located on a side of the gate electrode away from the base substrate, an interlayer insulation layer located on a side of the second gate insulation layer away from the base substrate, and a source electrode and a drain electrode located on a side of the interlayer insulation layer away from the base substrate; the storage capacitor comprises a first electrode plate and a second electrode plate, the first electrode plate is located on the same layer as the gate electrode, and the second electrode plate is located between the second gate insulation layer and the interlayer insulation layer; and the plurality of first fan-out lines, the plurality of first lead wires of first type, the gate electrode and the first electrode plate all are located on the same layer, and the plurality of second fan-out lines, the plurality of first lead wires of second type and the second electrode plate are located on the same layer.

At least one embodiment of the disclosure provides a display device, comprising the display panel according to any one of the items mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

The immature integrated circuit (IC) drive technology of AMOLED leads to the impact of resistance difference between source lines on display effect of a display image, which is shown as a red display image and bright lines in a column direction.

The display image is usually regulated by gamma correction. However, restriction on technical specifications results in a limited regulating ability of gamma correction.

It is therefore necessary to consider in a layout design the negative impact of the resistance difference between data lines on the display. In the process of panel design, compensation can be performed at locations with great difference between the data lines, so that resistance change tends to be gentle, which is conducive to uniformity of the display image and better user experience.

Figure 1:
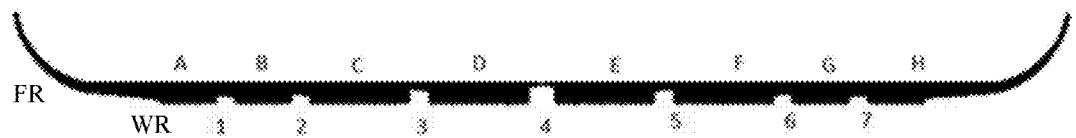
FIG. 1 is a schematic diagram of a peripheral region of a display panel.

FIG. 1 is a schematic diagram of a peripheral region of a display panel. The peripheral region comprises a lead wire region WR and a fan-out region FR. In FIG. 1 are shown eight fan-out subregions: subregion A, subregion B, subregion C, subregion D, subregion E, subregion F, subregion G and subregion H. The division of the fan-out region FR into a plurality of fan-out subregions will reduce a size of the longitudinal frame. There is an interval between the lead wires respectively corresponding to adjacent subregions, and in FIG. 1 are shown seven intervals: interval 1, interval 2, interval 3, interval 4, interval 5, interval 6 and interval 7. Data lines have sudden resistance change at the interval 1, interval 2, interval 3, interval 4, interval 5, interval 6 and interval 7. The resistance will suddenly change at these locations without compensation. For example, it is possible to dispose a part of power lines at the intervals to reduce parasitic capacitance. The power lines comprise at least one of a first power signal line and a second power signal line mentioned later.

Figure 2:
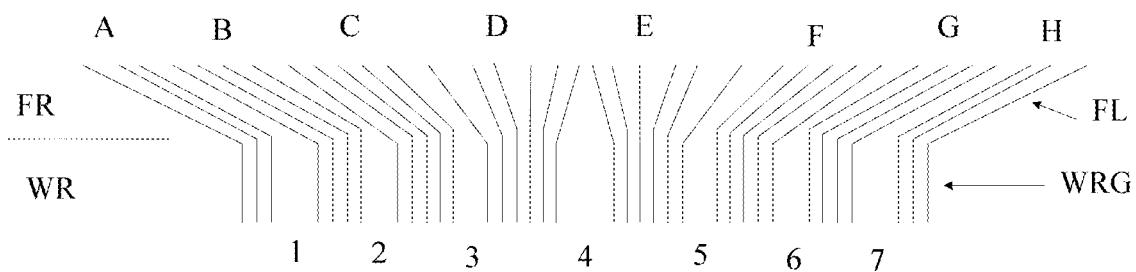
FIG. 2 is a schematic diagram of a peripheral region of a display panel.

FIG. 2 is a schematic diagram of a peripheral region of a display panel. In FIG. 2 are shown fan-out lines FL in the fan-out region FR and lead wires WRG in the lead wire region WR. For clear illustration, all the fan-out lines FL and not all the lead wires WRG are shown in FIG. 2. The number of the fan-out lines FL and the lead wires WRG can be determined as needed.

Figure 3:
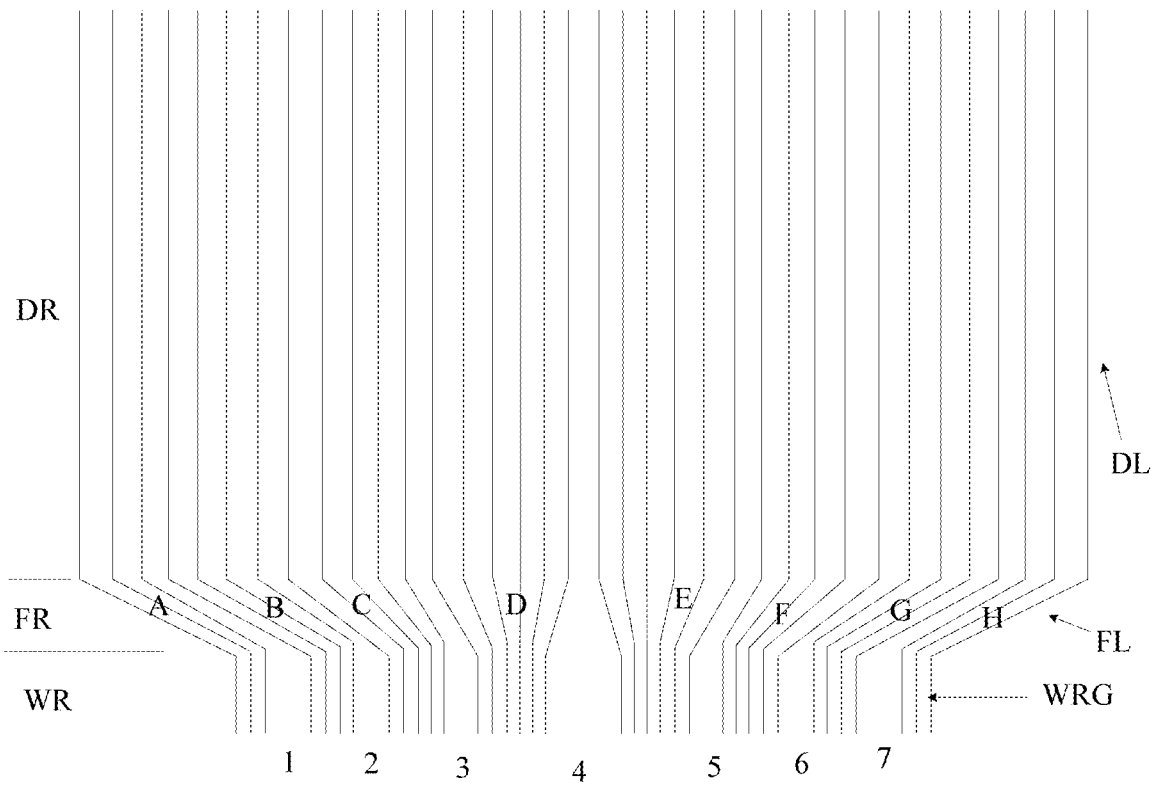
FIG. 3 is a schematic diagram of a display panel.

FIG. 3 is a schematic diagram of a display panel. As shown in FIG. 3, the display panel comprises a display region DR, the fan-out region FR and the lead wire region WR. The display region DR comprises the data lines DL, the fan-out region FR comprises the fan-out lines FL, and the lead wire region WR comprises the lead wires WRG. The fan-out lines FL are connected with the data lines DL in the display region DR which is located on a side of the fan-out region FR away from the lead wire region WR, and namely, the fan-out region FR is located between the display region DR and the lead wire region WR.

For example, as shown in FIGS. 2 and 3, of a plurality of lead wires WRG in every fan-out subregion, each lead wire WRG has a width of about 2 μm, with a distance between adjacent lead wires WRG of about 16 μm, to which the disclosure is not limited.

Figure 4:
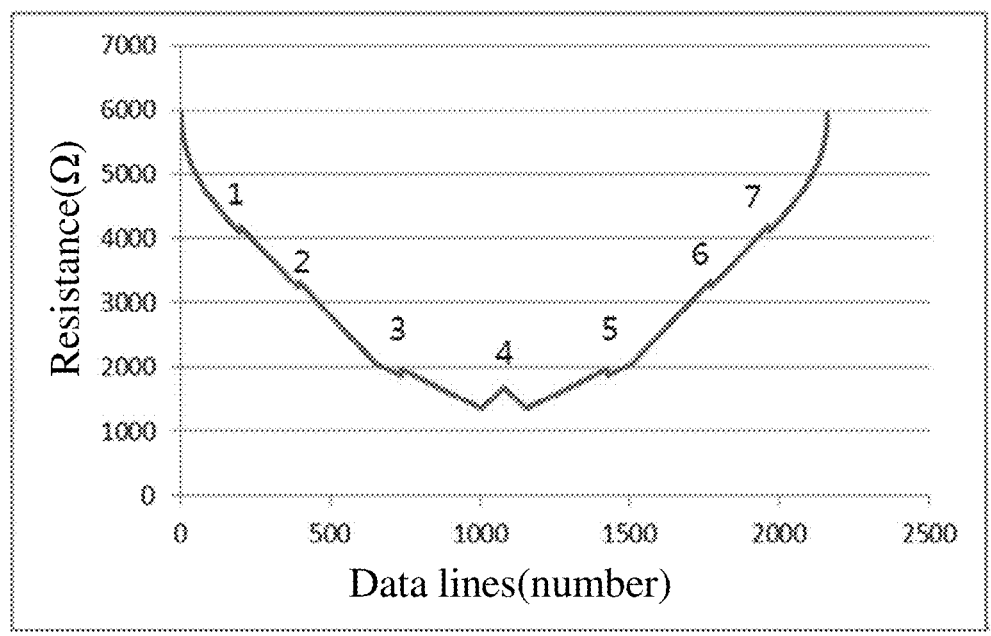
FIG. 4 is a schematic diagram illustrating a resistance distribution of data lines of a display panel.

FIG. 4 is a schematic diagram illustrating a resistance distribution of data lines of a display panel. As shown in FIG. 4, at the seven intervals, there is large resistance difference between the data lines, which can easily lead to a red display image and bright lines in a column direction, thus affecting display effect of the display image.

It is therefore necessary to consider in the layout design the negative impact of the resistance difference between the data lines on the display. In the display panel provided in embodiments of the disclosure, in the process of panel design, compensation can be performed at locations with great resistance difference between the data lines, so that the resistance change of the data lines tends to be gentle, which is conducive to the uniformity of the display image and the better user experience.

Figure 5:
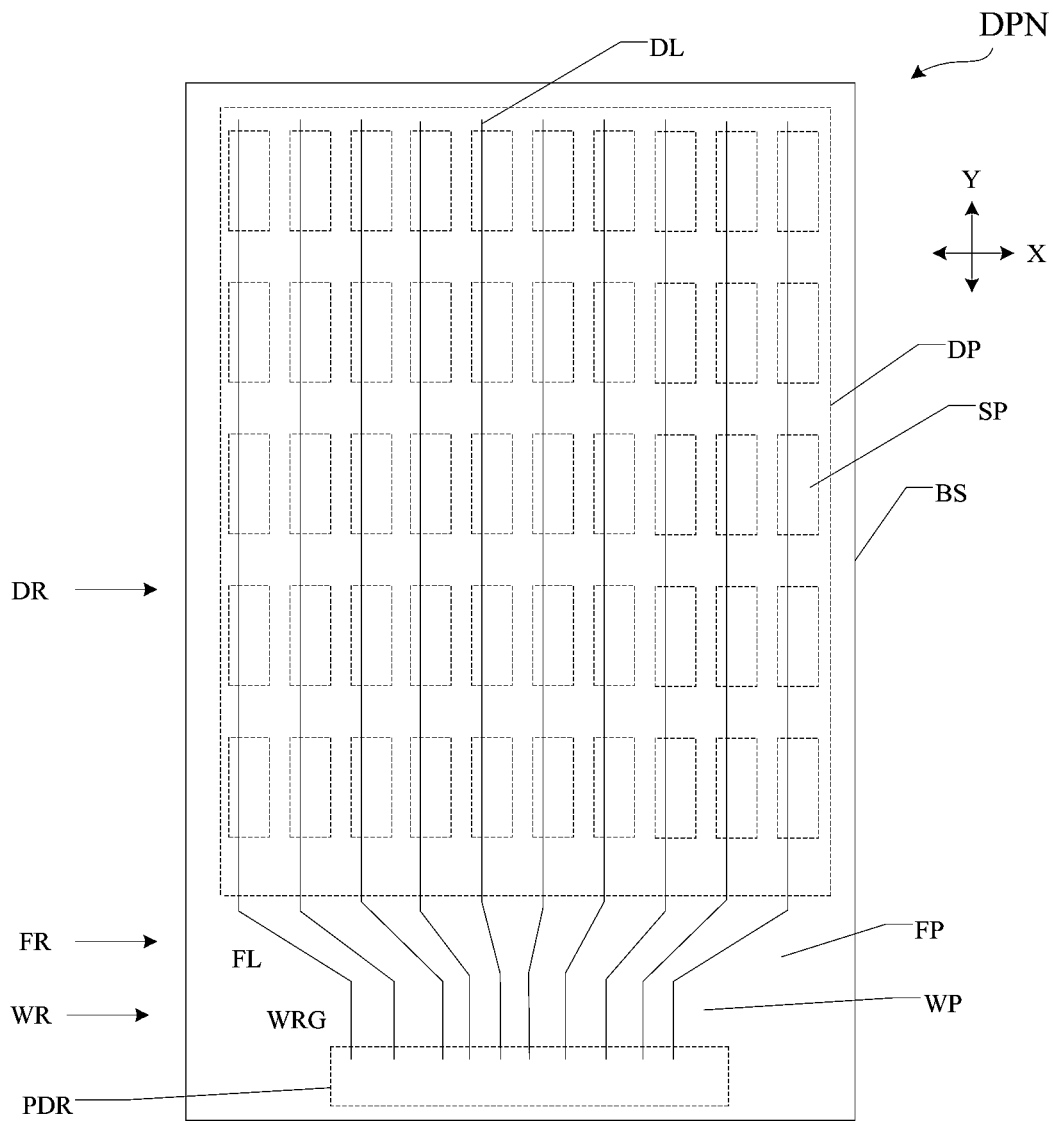
FIG. 5 is a plan view of a display panel.

FIG. 5 is a plan view of a display panel. As shown in FIG. 5, the display panel DPN comprises the display region DR, the fan-out region FR, the lead wire region WR and a connection pad region PDR. The display region DR, the fan-out region FR, the lead wire region WR and the connection pad region PDR are arranged successively along a Y direction. The display region DR is provided with a display part DP comprising the data lines DL, the fan-out region FR is provided with a fan-out part FP comprising the fan-out lines FL, and the lead wire region WR is provided with a lead wire part WP comprising the lead wires WRG.

As shown in FIG. 5, the lead wire region WR comprises a plurality of lead wires WRG, and the fan-out region FR comprises a plurality of fan-out lines FL. The plurality of lead wires WRG in the lead wire region WR are respectively connected with the plurality of fan-out lines FL in the fan-out region FR, and the plurality of fan-out lines FL are respectively connected with a plurality of data lines DL in the display region DR. The plurality of fan-out lines FL gradually disperse from a location close to the lead wire part WP to a location close to the display part DP. Namely, the plurality of fan-out lines FL gradually approach each other from the location close to the display part DP to the location close to the lead wire part WP.

As shown in FIG. 5, the display panel comprises a base substrate BS on which are disposed the data lines DL, the fan-out lines FL and the lead wire lines WRG. The data lines DL are located in the display region DR and are connected, through the fan-out lines FL, with the lead wires WRG extending to the connection pad region PDR. As shown in FIG. 5, the plurality of lead wires WRG are disposed successively along an X direction. For example, the X direction and the Y direction are crossed. Further, for example, the X direction is perpendicular to the Y direction. The X direction being perpendicular to the Y direction is taken as an example to explain the embodiments of the disclosure. As shown in FIG. 5, the lead wires WRG extend along the Y direction, and the data lines DL extend along the Y direction. For example, the plurality of data lines DL are parallel to each other, to which the disclosure is not limited.

As shown in FIG. 5, the plurality of lead wires WRG are arranged along the X direction, with each lead wire WRG extending along the Y direction. For example, the plurality of lead wires WRG are parallel to each other, to which the disclosure is not limited. In the embodiments of the disclosure, a size of a lead wire WRG along the X direction is defined as width, and a size of a lead wire WRG along the Y direction is defined as length.

As shown in FIG. 5, the plurality of data lines DL are arranged along the X direction, with each data line DL extending along the Y direction. For example, the plurality of data lines DL have the same width and the same length, to which the disclosure is not limited.

As shown in FIG. 5, the fan-out lines FL are neither parallel to the Y direction nor the X direction. Of course, in other embodiments, the display panel can also have the fan-out lines FL parallel to the Y direction.

As shown in FIG. 5, in the display panel DPN, the display part DP further comprises subpixels SP which are connected with the data lines DL. As shown in FIG. 5, the display panel DPN comprises a plurality of subpixels SP. One data line DL is connected with a column of subpixels SP. For example, the plurality of subpixels SP are arranged in an array, to which the disclosure is not limited. In FIG. 5, the exemplification is made by arranging the plurality of subpixels SP in an array.

Figure 6:
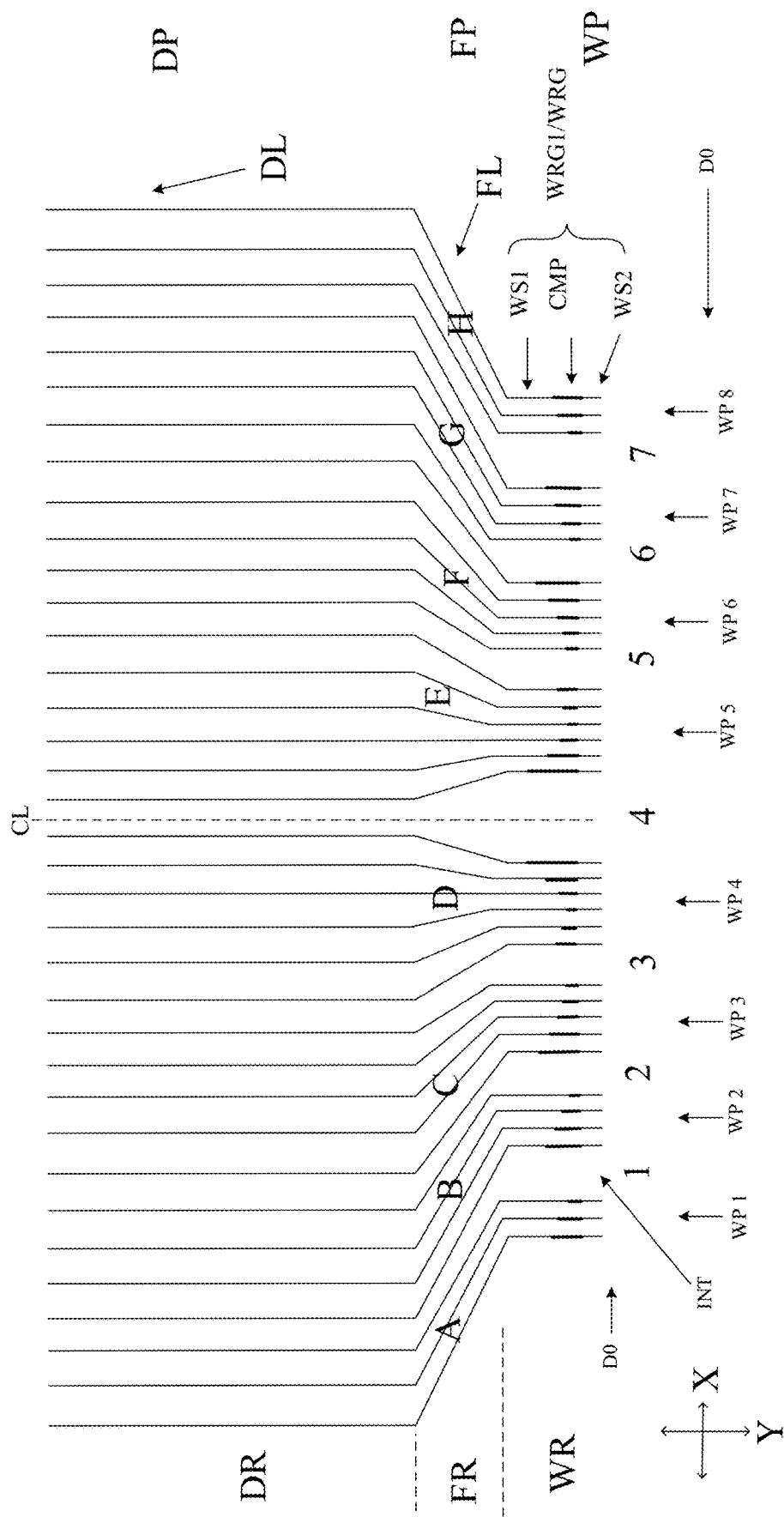
FIG. 6 is a plan view of a display panel provided in an embodiment of the disclosure.

FIG. 6 is a plan view of a display panel provided in an embodiment of the disclosure. As shown in FIG. 6, the display panel comprises the display part DP, the fan-out part FP and the lead wire part WP. The display part DP is located in the display region DR, the fan-out part FP in the fan-out region FR, and the lead wire part WP in the lead wire region WR. The display part DP comprises a plurality of data lines DL, and the fan-out part FR comprises a plurality of fan-out lines FL. The lead wire part WP comprises a plurality of first lead wires WRG1 which are respectively connected with the plurality of data lines DL respectively through the plurality of fan-out lines FL which are fanned out between the lead wire part WP and the display part DP. For example, the first lead wires WRG1 have the same extension direction as the data lines DL. In the embodiments of the disclosure, two lines/wires having the same extension direction encompasses the lines/wires having the completely same and approximately same extension direction, and this explanation can be referred for the following related description. The plurality of fan-out lines FL disperse in a direction from the lead wire part WP to the display part DP. The plurality of fan-out lines FL gradually disperse from the location close to the lead wire part WP to the location close to the display part DP. For example, the plurality of fan-out lines corresponding to the same lead wire part WP have different lengths, to which the disclosure is not limited.

As shown in FIG. 6, the fan-out region FR comprises eight fan-out subregions: subregion A, subregion B, subregion C, subregion D, subregion E, subregion F, subregion G and subregion H.

As shown in FIG. 6, the plurality of first lead wires WRG1 each comprise a first lead wire subpart WS1 and a compensation part CMP to form a plurality of first lead wire subparts WS1 and a plurality of compensation parts CMP, with the plurality of first lead wire subparts WS1 respectively connected with the plurality of compensation parts CMP. In the plan view of the display panel, the first lead wire subparts WS1 have a different width from the compensation parts CMP, in a direction perpendicular to an extension direction of the first lead wires WRG1.

In the embodiments of the disclosure, the first lead wire subparts WS1 have a different width from the compensation parts CMP in order for the compensation parts CMP to compensate for resistances of the data lines, so that the resistance difference between the data lines is effectively reduced. Resistance compensation at the locations with great resistance difference between the data lines will reduce resistance difference value between the data lines in regions with sudden change in resistance, so that the resistance change of the data lines tends to be gentle, which is conducive to the uniformity of the display image and the better user experience.

As shown in FIG. 6, the plurality of first lead wires WRG1 are arranged successively along the X direction. For example, the X direction and the Y direction are crossed. Further, for example, the X direction is perpendicular to the Y direction. The X direction being perpendicular to the Y direction is taken as an example to explain the embodiments of the disclosure.

As shown in FIG. 6, the first lead wires WRG1 extend along the Y direction. In the embodiments of the disclosure, a size of a first lead wire WRG1 along the X direction is defined as width, and a size of a first lead wire WRG1 along the Y direction is defined as length.

As shown in FIG. 6, the plurality of data lines DL are arranged along the X direction, each of which extends along the Y direction. For example, the data lines DL are configured to input data signals to the subpixels. For example, the data signals comprise voltage. For example, the data lines DL are connected with a source or drain electrode of a thin film transistor, and are configured to input data signals to the source or drain electrode of the thin film transistor. For example, connected with the source electrode, the data lines DL are integrated with the source electrode, and connected with the drain electrode, the data lines DL are integrated with the drain electrode. For example, the data lines DL are configured to input data voltage to the source or drain electrode of a data write transistor. For example, the display panel comprises a plurality of subpixels with which the plurality of data lines DL are electrically connected, each data line is connected with a column of subpixels and is configured to provide data signals to the subpixels. For example, each data line is configured to provide data signals to open subpixels. For example, the plurality of subpixels are formed into multiple rows and multiple columns. For example, the display panel is an organic light emitting diode display panel, and comprises a capacitor, a plurality of thin film transistors and a plurality of light emitting units. For example, the display panel is that using structures such as 7T1C, to which the disclosure is not limited. For example, the light emitting units comprise organic light emitting diodes. The organic light emitting diodes comprise a cathode, a light emitting functional layer and an anode, with the light emitting functional layer located between the cathode and the anode. The anode is connected with one of the source electrode and the drain electrode of the data write transistor. The light emitting functional layer comprises at least a light emitting layer, and can further comprise at least one of a hole transport layer, a hole injection layer, an electron transport layer and an electron injection layer.

As shown in FIG. 6, the fan-out lines FL are neither parallel to the Y direction nor the X direction. Of course, in other embodiments, the display panel can also have the fan-out lines FL parallel to the Y direction. As shown in FIG. 6, at least a part of fan-out lines FL have a different extension direction from the data lines DL.

For example, in the embodiments of the disclosure, an extension direction of a line/wire is a direction perpendicular to its width direction, to which the disclosure is not limited. Not being a straight line, the line has the extension direction determined according to its overall extension trend. For example, the line has the extension direction determined according to a connection line between its initial end and its terminal end, to which the disclosure is not limited.

As shown in FIG. 6, the display panel comprises a plurality of lead wire parts WP. The display panel comprising eight lead wire parts is taken as an example to explain in FIG. 6. The eight lead wire parts are respectively a first lead wire part WP1, a second lead wire part WP2, a third lead wire part WP3, a fourth lead wire part WP4, a fifth lead wire part WP5, a sixth lead wire part WP6, a seventh lead wire part WP7 and an eighth lead wire part WP8.

As shown in FIG. 6, the first lead wire part WP1, the second lead wire part WP2, the third lead wire part WP3 and the fourth lead wire part WP4 have their respective numbers of lead wires which increases successively, and the fifth lead wire part WP5, the sixth lead wire part WP6, the seventh lead wire part WP7 and the eighth lead wire part WP8 have their respective numbers of lead wires which decreases successively. Of course, in other embodiments, the number of lead wires in each lead wire part cannot follow the above rule, and can be determined as needed.

As shown in FIG. 6, the first lead wire subparts WS1 are closer to the fan-out part FP than the compensation parts CMP, and have a smaller width than the compensation parts CMP. A larger width of a compensation part CMP facilitates the reduction in resistance of a data line. In the display panel provided in some embodiments of the disclosure, the resistance of a data line is reduced by the increase in width of the line.

For example, in the same lead wire part WP, adjacent compensation parts CMP have the same width. For example, in all the lead wire parts WP, all the compensation parts CMP have the same width. The same width of the compensation parts facilitates the manufacture and the computation of compensation amount.

For example, as shown in FIG. 6, adjacent compensation parts CMP have different lengths in the extension direction of the first lead wires WRG1. Of course, the display panel shown in FIG. 6 can also have adjacent compensation parts CMP with the same length.

For example, in any of the first lead wire part WP1, the second lead wire part WP2, the third lead wire part WP3, the sixth lead wire part WP6, the seventh lead wire part WP7 and the eighth lead wire part WP8 (except for the one(s) of the fourth lead wire part WP4 and the fifth lead wire part WP5), the plurality of compensation parts CMP have lengths changing gradually along a direction the plurality of first lead wires are arranged. In the display panel provided in some embodiments of the disclosure, resistance compensation is performed by the gradual change in length to avoid sudden resistance change of the data lines, thus achieving the gentle resistance change of the data lines and the smaller resistance difference value.

For example, the number of the plurality of first lead wires WRG1 is n, the longest one of the plurality of compensation parts CMP, has a length of H, and the plurality of compensation parts CMP have a gradual change amount of length of $\Delta$(H/n).

For example, as shown in FIG. 6, the display panel has a center line CL which has the same extension direction as the first lead wires WRG1. In any of the first lead wire part WP1, the second lead wire part WP2, the third lead wire part WP3, the sixth lead wire part WP6, the seventh lead wire part WP7 and the eighth lead wire part WP8 (except for the one(s) of the fourth lead wire part WP4 and the fifth lead wire part WP5), the plurality of compensation parts CMP have lengths decreasing gradually in a direction DO from edges of the display panel to the center line CL.

For example, in any of the fourth lead wire part WP4 and the fifth lead wire part WP5, the plurality of compensation parts CMP have lengths decreasing gradually and then increasing gradually in the direction DO from the edges of the display panel to the center line CL.

For example, as shown in FIG. 6, a first lead wire WRG1 further comprises a second lead wire subpart WS2 connected with a compensation part CMP and having a smaller width than the compensation part CMP, with the second lead wire subpart WS2 and a corresponding first lead wire subpart WS1 respectively arranged on both sides of the compensation parts CMP. The second lead wire subpart WS2 is located on a side of the compensation part CMP away from the display part. The arrangement of the second lead wire subpart WS2 facilitates the manufacture of the compensation part CMP.

For example, as shown in FIG. 6, between adjacent lead wire parts WP there is an interval INT whose width is larger than a distance between adjacent first lead wires WRG1 in any one of the adjacent lead wire parts WP. The distance between adjacent first lead wires WRG1 in a lead wire part WP is a distance between adjacent first lead wires WRG1, and is a distance between adjacent first lead wires WRG1 in the X direction.

For example, in FIG. 6 are shown seven intervals INT, different intervals INT have the same size in the X direction and may also have different sizes in the X direction.

For example, as shown in FIG. 6, of the plurality of lead wires WRG in each fan-out subregion, each one has a portion with a width of about 2 μm, except for the compensation part CMP with a width of about 12 μm. There is a distance of about 16 μm between portions of adjacent lead wires except for the compensation parts CMP, with a distance of about 6 μm between adjacent compensation parts CMP, to which the disclosure is not limited.

For example, as shown in FIG. 6, each lead wire has a length of about 900 μm, with the largest length of the compensation parts CMP of about 800 μm, to which the disclosure is not limited.

For example, as shown in FIG. 6, the plurality of first lead wires WRG1 are insulated from each other, to which signals can be input respectively.

For example, as shown in FIG. 6, for the decrease in area of the compensation parts CMP along the Y direction to reduce a lower frame of the display panel, multiple compensation parts CMP overlap in the X direction. For example, multiple compensation parts CMP at least partly overlap in the X direction.

Figure 7:
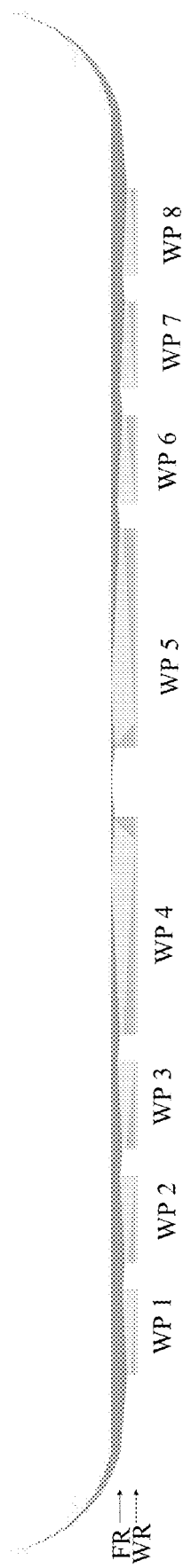
FIG. 7 is a partial schematic diagram of a display panel provided in an embodiment of the disclosure.

For example, as shown in FIG. 6, the first lead wires WRG1 are straight lines and the data lines DL are straight lines, to which the disclosure is not limited. In FIG. 6, the fan-out lines FL are shown in a form of straight line, to which the disclosure is not limited. The fan-out lines are not limited to straight lines, and can also be other forms of lines such as curves and arcs. Referring to FIG. 7, the fan-out lines FL are in the form of arcs on a left and right side of the display panel.

In other embodiments, the resistance compensation cannot be performed of the lead wire parts WP close to the edges of the display panel. For example, in the display panel shown in FIG. 6, the resistance compensation cannot be performed on the lead wires of the first lead wire part WP1 and the eighth lead wire part WP8, and namely, each lead wire of the first lead wire part WP1 and the eighth lead wire part WP8 has the same width everywhere in the X direction. The lead wires of the first lead wire part WP1 and the eighth lead wire part WP8 are second lead wires WRG2 mentioned later.

As shown in FIG. 6, between a data line DL and a fan-out line FL there is an included angle larger than 90° and less than 180° which is an obtuse angle. Accordingly, due to the same extension direction of a data line DL as a first lead wire WRG1, between the first lead wire WRG1 and the fan-out line FL there is also an included angle larger than 90° and less than 180°. As shown in FIG. 6, the extension of the fan-out lines FL in the fan-out region FR leads to the gradually decreasing distance between two adjacent fan-out lines FL in a direction from the display region to the lead wire region because the fan-out lines FL fan out in the fan-out region FR. For example, as shown in FIG. 6, in the same fan-out subregion, there is the same distance between every two adjacent data lines DL, and there is the same distance between every two adjacent first lead wires WRG1. The included angle between at least one of the plurality of data lines DL and at least one of the plurality of fan-out lines FL, is an obtuse angle. The fan-out lines FL are described schematically as straight lines in FIG. 6, and can also be curves. With the fan-out lines FL being curves, an included angle between a data line D and a fan-out line FL is an included angle between the data line D and a tangent of the fan-out line FL in the form of curve. As shown in FIG. 6, a distance between adjacent data lines DL of the plurality of data lines DL is larger than that between adjacent first lead wires WRG1 of the plurality of first lead wires WRG1.

FIG. 7 is a partial schematic diagram of a display panel provided in an embodiment of the disclosure. For clear illustration, the display region and parts therein are not shown in FIG. 7.

For example, as shown in FIG. 6 and FIG. 7, the plurality of compensation parts CMP of the first lead wire part WP1 have a total area of A1, the plurality of compensation parts CMP of the second lead wire part WP1 have a total area of A2, the plurality of compensation parts CMP of the third lead wire part WP1 have a total area of A3 and the plurality of compensation parts CMP of the fourth lead wire part WP1 have a total area of A4. As seen in FIG. 6 and FIG. 7, A1, A2, A3 and A4 increase successively.

For example, as shown in FIG. 6 and FIG. 7, the plurality of compensation parts CMP of the fifth lead wire part WP1 have a total area of A5, the plurality of compensation parts CMP of the sixth lead wire part WP1 have a total area of A6, the plurality of compensation parts CMP of the seventh lead wire part WP1 have a total area of A7 and the plurality of compensation parts CMP of the eighth lead wire part WP1 have a total area of A8. As seen in FIG. 6 and FIG. 7, A5, A6, A7 and A8 decrease successively.

For example, as shown in FIG. 6 and FIG. 7, the plurality of lead wire parts WP are arranged symmetrically relative to the center line CL of the display panel. In this case, A1=A8, A2=A7, A3=A6 and A4=A5.

For example, as shown in FIG. 6 and FIG. 7, in the direction DO from the edges of the display panel to the center line CL, in the first lead wire part WP1 to the fourth lead wire part WP4, their respective total areas of the plurality of compensation parts CMP increase gradually. Namely, A1, A2, A3 and A4 increase successively.

For example, as shown in FIG. 6 and FIG. 7, in the direction DO from the edges of the display panel to the center line CL, in the fifth lead wire part WP5 to the eighth lead wire part WP8, their respective total areas of the plurality of compensation parts CMP decrease gradually. Namely, A8, A7, A6 and A5 increase successively.

For example, as shown in FIG. 6 and FIG. 7, in the direction from the edges of the display panel to the center line CL, the plurality compensation parts CMP of the lead wire part WP close to the center line CL have a larger total area than those of the lead wire part WP away from the center line CL. For example, A4>A3>A2>A1. For example, A5>A6>A7>A8.

For example, as shown in FIG. 6 and FIG. 7, of the first lead wire part WP1 to the fourth lead wire part WP4, the compensation parts CMP all have the same width. In the direction DO from the edges of the display panel to the center line CL, the respective longest compensation parts CMP of the lead wire parts have lengths increasing successively. As shown in FIG. 6 and FIG. 7, the longest compensation part CMP of the first lead wire part WP1 is the compensation part CMP farthest from the center line CL, the longest compensation part CMP of the second lead wire part WP2 is the compensation part CMP farthest from the center line CL, the longest compensation part CMP of the third lead wire part WP3 is the compensation part CMP farthest from the center line CL, and the longest compensation part CMP of the fourth lead wire part WP4 is the compensation part CMP closest to the center line CL. It is possible to infer the situation of the respective longest compensation parts CMP of the fifth lead wire part WP5 to the eighth lead wire part WP8, from the symmetrical arrangement of the display panel relative to the center line CL.

Figure 8:
FIG. 8 is a schematic diagram of lead wire parts on a left side of a center line in FIG. 7.

FIG. 8 is a schematic diagram of lead wire parts on a left side of a center line in FIG. 7. In FIG. 8 is further shown an interval INT between adjacent lead wire parts.

Figure 9:
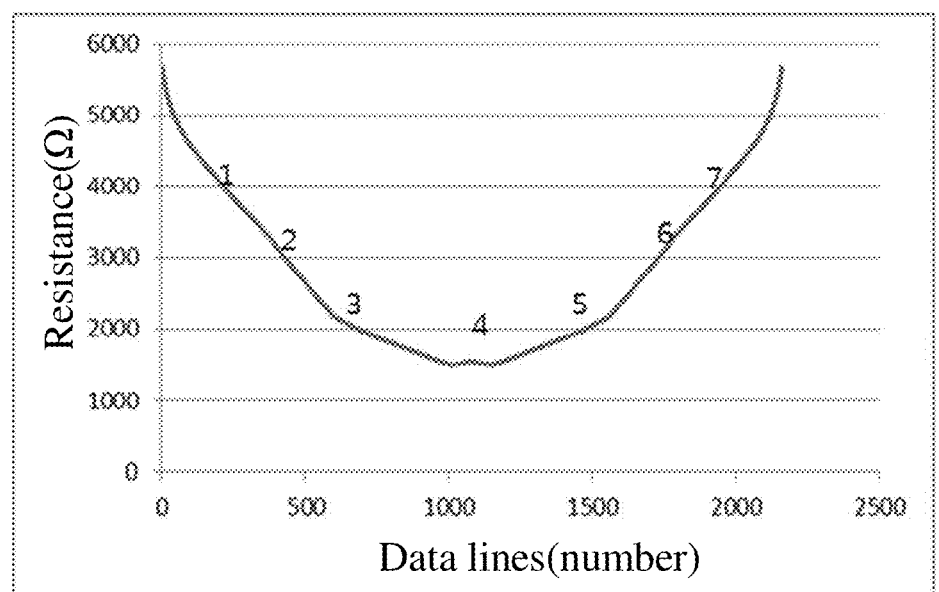
FIG. 9 is a schematic diagram illustrating a resistance distribution of data lines of a display panel provided in an embodiment of the disclosure.

FIG. 9 is a schematic diagram illustrating a resistance distribution of data lines of a display panel provided in an embodiment of the disclosure. A resistance distribution of the compensated data lines is shown in FIG. 9. Compared with the uncompensated display panel in FIG. 4, the compensated data lines have a smaller overall resistance difference. As shown in FIG. 9, in the display panel provided in the embodiments of the disclosure, at the seven intervals, the resistance change tends to be gentle and there is a smaller resistance difference between the data lines, with remarkable compensation effect, thus avoiding the red display image and the bright lines in the column direction and improving the display effect of the display image.

Figure 10:
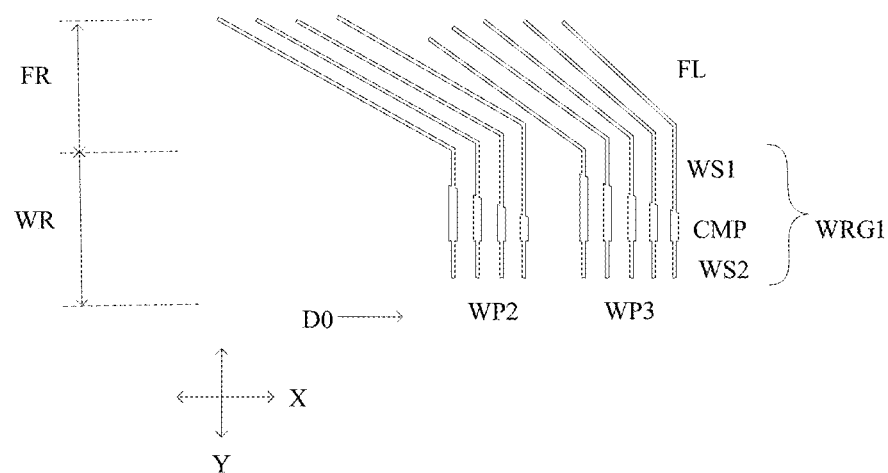
FIG. 10 is a partial plan view of a display panel provided in an embodiment of the disclosure.

FIG. 10 is a partial plan view of a display panel provided in an embodiment of the disclosure. For example, FIG. 10 is a plan view of the second lead wire part WP2 and the third lead wire part WP3. As seen in FIG. 10, the compensation parts CMP all have the same width. In the direction DO from the edges of the display panel to the center line CL, the compensation parts CMP of the second lead wire part WP2 have their respective lengths decreasing successively. In the direction DO from the edges of the display panel to the center line CL, the compensation parts CMP of the third lead wire part WP3 have their respective lengths decreasing successively. As shown in FIG. 10, in the direction DO from the edges of the display panel to the center line CL, the respective longest compensation parts CMP of the lead wire parts have their respective length increasing successively. The longest compensation part CMP of the third lead wire part WP3 has a larger length than that of the second lead wire part WP2. Of course, the second lead wire part WP2 and the third lead wire part WP3 in FIG. 10 can be respectively replaced by the first lead wire part WP1 and the second lead wire part WP2.

Figure 11:
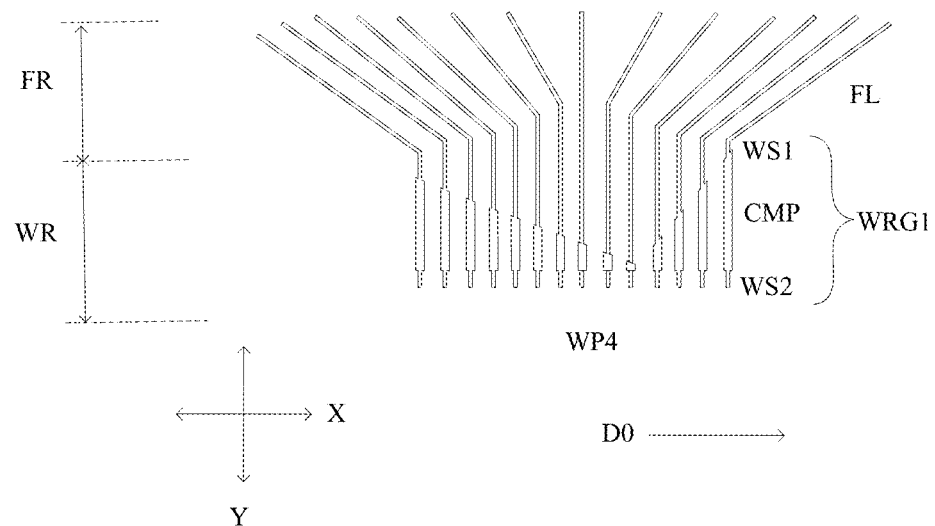
FIG. 11 is a partial plan view of a display panel provided in an embodiment of the disclosure.

FIG. 11 is a partial plan view of a display panel provided in an embodiment of the disclosure. For example, FIG. 11 is a plan view of the fourth lead wire part WP4. As seen in FIG. 11, the compensation parts CMP all have the same width. In the direction DO from the edges of the display panel to the center line CL, the compensation parts CMP of the fourth lead wire part WP4 have their respective lengths decreasing successively and then increasing successively, with the leftmost compensation part CMP having a smaller length than the rightmost one.

Figure 12:
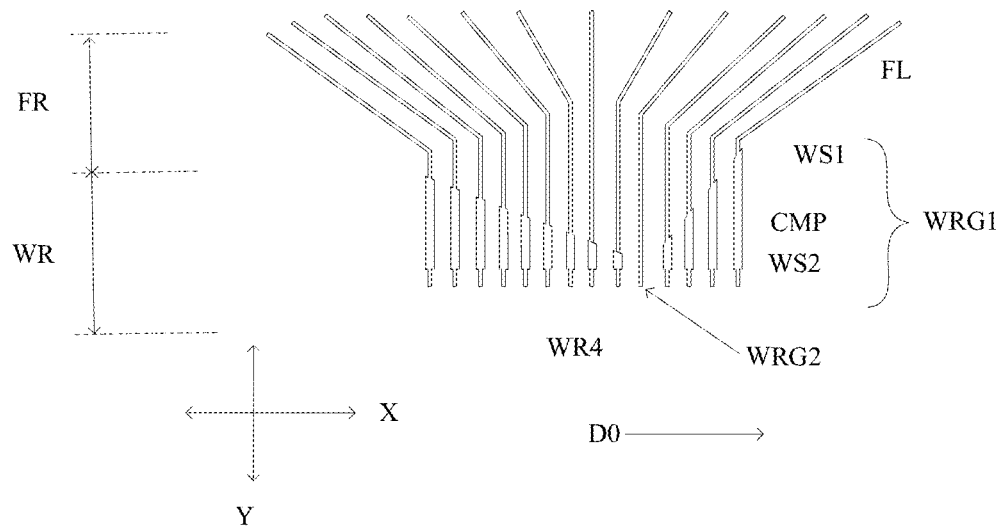
FIG. 12 is a partial plan view of a display panel provided in an embodiment of the disclosure.

FIG. 12 is a partial plan view of a display panel provided in an embodiment of the disclosure. Compared with FIG. 11, the fourth lead wire part WR4 further comprises the second lead wire WRG2. The second lead wire WRG2 has the same width everywhere, and namely, the second lead wire WRG2 does not have the compensation part. One second lead wire WRG2 is shown in FIG. 12, but the number of the second lead wires WRG2 is not limited to this, and can be determined as needed. For example, the display panel further comprises a plurality of second lead wires WRG2 which each have the same width everywhere. For example, the plurality of second lead wires WRG2 are arranged successively, and there is no lead wire with compensation part arranged between adjacent second lead wires. For example, each second lead wire WRG2 is connected with a data line in the display region through a fan-out line.

Figure 13:
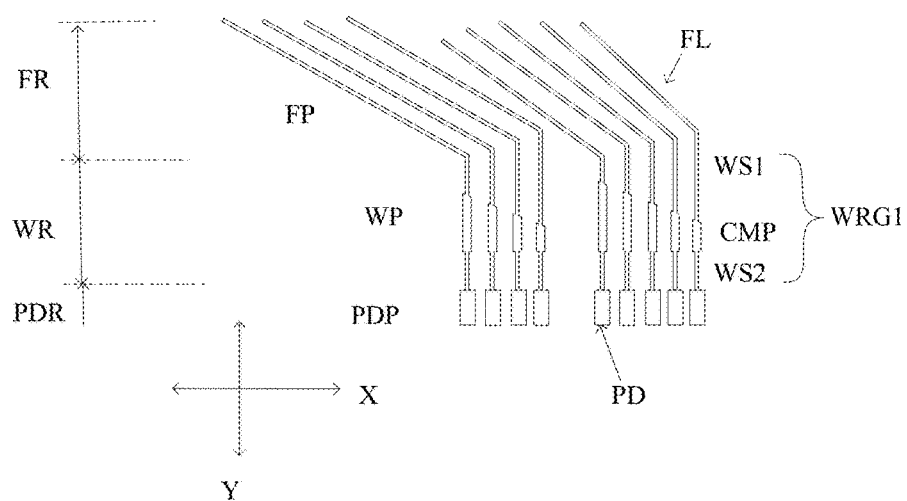
FIG. 13 is a partial plan view of a display panel provided in an embodiment of the disclosure.

FIG. 13 is a partial plan view of a display panel provided in an embodiment of the disclosure. Compared with FIG. 11, the display panel further comprises a connection pad part PDP which is configured to be connected with an external circuit. The connection pad part PDP comprises a plurality of connection pads PD, is located in a connection pad region and is located on a side of the lead wire parts WP away from the fan-out parts. The external circuit is configured to input respectively signals to the plurality of data lines through the plurality of connection pads PD. The plurality of connection pads PD are electrically connected with the plurality of first lead wires WRG1. In other embodiments, the display panel can also comprise the connection pad part PDP, and namely a connection pad is arranged on a side of each lead wire away from the data lines DL.

In a display panel provided in some embodiments of the disclosure, the compensation is performed by the compensation parts with the same width and their respective lengths changing gradually to facilitate the resistance compensation of the data lines and reduce the resistance difference between the data lines. A detailed description of the display panel with the structure will be given in the following. For example, the resistance difference between the data lines results generally from length difference between the fan-out lines in the fan-out region, and thus the resistance compensation of the data lines can be considered as that of the fan-out lines in the fan-out region.

Figure 14:
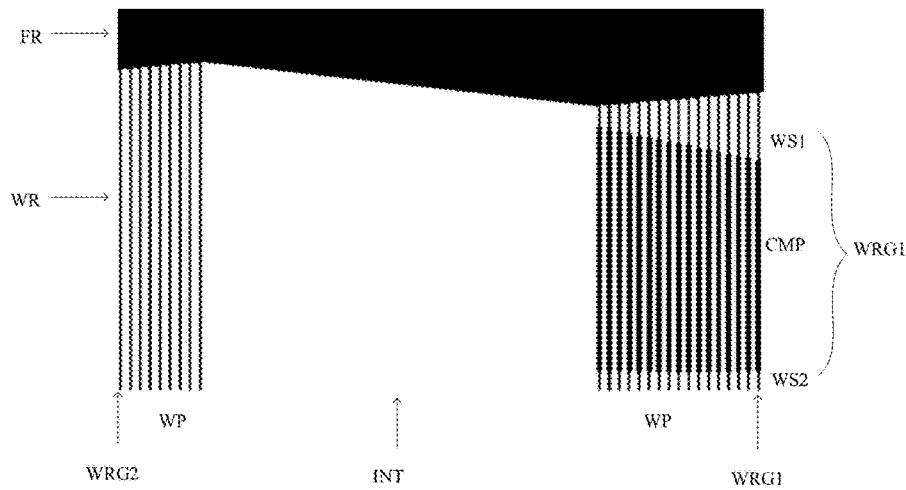
FIG. 14 is a partial plan view of a display panel provided in an embodiment of the disclosure.

FIG. 14 is a partial plan view of a display panel provided in an embodiment of the disclosure. In FIG. 14 is shown an interval INT between adjacent lead wire parts WP, which can be a plan view at anyone of the interval 1, 2 and 3 in FIG. 6 or FIG. 7. As shown in FIG. 14, the lead wire part WP on the right side comprises a plurality of first lead wires WRG1. A first lead wire WRG1 comprises a first lead wire subpart WS1, a compensation part CMP and a second lead wire subpart WS2. The resistance compensation of the data lines is performed in the compensation way of the respective compensation parts CMP of the plurality of lead wires WRG1 with the same width and their respective lengths changing gradually. As shown in FIG. 14, the lead wire part WP on the left side comprises second lead wires WRG2 without the compensation part and with the same width everywhere.

Figure 15:
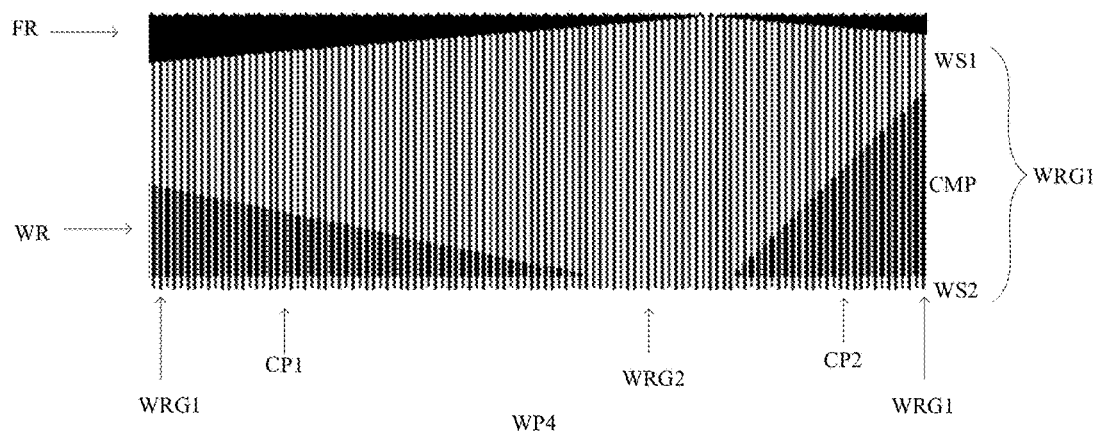
FIG. 15 is a partial plan view of a display panel provided in an embodiment of the disclosure.

FIG. 15 is a partial plan view of a display panel provided in an embodiment of the disclosure. The lead wire part shown in FIG. 15 can be the fourth lead wire part WP4 in FIG. 6 or FIG. 7. The fourth lead wire part WP4 comprises a plurality of first lead wires WRG1. A first lead wire WRG1 comprises a first lead wire subpart WS1, a compensation part CMP and a second lead wire subpart WS2. In FIG. 15 are shown two compensation units CP1 and CP2 between which there are second lead wires WRG2 with the same width everywhere. The resistance compensation of the data lines is performed in the compensation way of all the compensation parts of the compensation unit CP1 and CP2 with the same width and their respective lengths changing gradually. The compensation parts of the compensation unit CP1 have their respective lengths decreasing gradually, and the compensation parts of the compensation unit CP2 have their respective lengths increasing gradually. Namely, of the fourth lead wire part WP4, the compensation parts have their respective lengths decreasing gradually and then increasing gradually.

The resistance compensation of the data lines corresponding to the fan-out lines in the subregion A to H (referring to FIG. 6), is taken as an example in the embodiments of the disclosure. The resistance compensation is performed in the compensation way of the compensation parts with the same width and their respective length changing gradually.

1. The compensation of the data lines corresponding to the fan-out lines in the subregion A starts with the first data line from the left, with the largest compensable resistance as an initial compensation amount, to which the disclosure is not limited. The initial compensation amount can also be less than the largest compensable resistance. The largest compensable resistance can be determined by width(s) and length(s) of the lead wires in the lead wire region. Namely, the largest compensable resistance is obtained according to the largest length of the lead wires, and the largest width of the lead wires permitted by process conditions. The compensation parts have the same width. The compensation parts have a line width of W. The longest compensation part has a line length of H1, the number of the data lines corresponding to the subregion A is n1, and a gradual change amount of line length for successive compensation is $\Delta(H1/n1)$. In the first lead wire part corresponding to the subregion A, the first compensation part has a line width of W and a line length of H1, the second compensation part has a line width of W and a line length of $H1-\Delta(H1/n1)$, the third compensation part has a line width of W and a line length of $H1-2*\Delta(H1/n1)$, and the k-th compensation part has a line width of W and a line length of $H1-(k-1)*\Delta(H1/n1)$. The resistance compensation of the data lines corresponding to the subregion A can be completed by the successive compensation in the similar way until the n1-th compensation part.

2. The compensation of the data lines corresponding to the fan-out lines in the subregion B starts with the first data line from the left, with the largest compensable resistance as an initial compensation amount. For example, the largest compensable resistance is a resistance difference value between two data lines of adjacent lead wire parts (the first and second lead wire part) closest to the interval 1 between them without compensation. For example, the largest compensation resistance is a resistance difference value R1 between data lines corresponding to two lead wires on the left and right side at the interval 1 with sudden resistance change. The compensation parts have the same width and have a line width of W. The longest compensation part has a line length of H2, the number of the data lines corresponding to the subregion B is n2, and a gradual change amount of line length for successive compensation is $\Delta(H2/n2)$. In the second lead wire part corresponding to the subregion B, the first compensation part from the left has a line width of W and a line length of H2, the second compensation part has a line width of W and a line length of $H2-\Delta(H2/n2)$, the third compensation part has a line width of W and a line length of $H2-2*\Delta(H2/n2)$, and the k-th compensation part has a line width of W and a line length of $H2-(k-1)*\Delta(H2/n2)$. The resistance compensation of the data lines corresponding to the subregion B can be completed by the successive compensation in the similar way until the n2-th compensation part.

3. The compensation of the data lines corresponding to the fan-out lines in the subregion C starts with the first data line from the left, with the largest compensable resistance as an initial compensation amount. For example, the largest compensable resistance is a resistance difference value between two data lines of adjacent lead wire parts (the second and third lead wire parts) closest to the interval 2 between them without compensation. For example, the largest compensable resistance is a resistance difference value R2 between data lines corresponding to two lead wires on the left and right side at the interval 2 with sudden resistance change. The compensation parts have the same width and have a line width of W. The longest compensation part has a line length of H3, the number of the data lines corresponding to the subregion C is n3, and a gradual change amount of line length for successive compensation is $\Delta(H3/n3)$. In the third lead wire part corresponding to the subregion C, the compensation part corresponding to the first data line from the left has a line width of W and a line length of H3, the second compensation part has a line width of W and a line length of $H3-\Delta(H3/n3)$, the third compensation part has a line width of W and a line length of $H3-2*\Delta(H3/n3)$, and the k-th compensation part has a line width of W and a line length of $H3-(k-1)*\Delta(H3/n3)$. The resistance compensation of the data lines corresponding to the subregion C can be completed by the successive compensation until the n3-th compensation part.

4. The compensation of the data lines corresponding to the fan-out lines in the subregion D is performed from the data lines on the left and right sides to the data line with the smallest resistance in the middle of the subregion D. The compensation resistance of the data line according to the left side of the subregion D has a magnitude equal to the resistance difference value R3 between the data lines corresponding to the two lead wires on the left and right side at the interval 3 with sudden resistance change, wherein the compensation part has a line width of W and a line length of H4. The largest compensable resistance is used for the compensation resistance of the data line corresponding to the right side of the subregion D, as an initial compensation amount, wherein the compensation part has a line width of W and a line length of H5. The number of the data lines from the left side to a location with the smallest resistance in the middle corresponding to the subregion D is n4, and a gradual change amount of line length for successive compensation is $\Delta(H4/n4)$. In the fourth lead wire part corresponding to the subregion D, the first compensation part from the left has a line width of W and a line length of H4, the second compensation part has a line width of W and a line length of $H4-\Delta(H4/n4)$, the third compensation part has a line width of W and a line length of $H4-2*\Delta(H4/n4)$, and the k-th compensation part has a line width of W and a line length of $H4-(k-1)*\Delta(H4/n4)$. The compensation is performed successively in the similar way until the n4-th compensation part. The number of the data lines from the right side to the location with the smallest resistance in the middle corresponding to the subregion D is n5, and a gradual change amount of line length for successive compensation is $\Delta(H5/n5)$. In the fourth lead wire part corresponding to the subregion D, the first compensation part from the right has a line width of W and a line length of H5, the second compensation part has a line width of W and a line length of $H5-\Delta(H5/n5)$, the third compensation part has a line width of W and a line length of $H5-2*\Delta(H5/n5)$, and the k-th compensation part has a line width of W and a line length of $H5-(k-1)*\Delta(H5/n5)$. The resistance compensation of the data lines corresponding to the subregion D can be completed by the successive compensation in the similar way until the n5-th compensation part.

5. The compensation of the data lines corresponding to the fan-out lines in the subregion E: the resulting compensation parts and the compensation parts in the fourth lead wire part corresponding to the subregion D are mirror symmetrical relative to the center line of the display panel.

6. The compensation of the data lines corresponding to the fan-out lines in the subregion F: the resulting compensation parts and the compensation parts in the third lead wire part corresponding to the subregion C are mirror symmetrical relative to the center line of the display panel.

7. The compensation of the data lines corresponding to the fan-out lines in the subregion G: the resulting compensation parts and the compensation parts in the second lead wire part corresponding to the subregion B are mirror symmetrical relative to the center line of the display panel.

8. The compensation of the data lines corresponding to the fan-out lines in the subregion H: the resulting compensation parts and the compensation parts in the first lead wire part corresponding to the subregion A are mirror symmetrical relative to the center line of the display panel.

If the fan-out region of the display panel comprises other number of subregions, their resistance compensation can be performed in the same compensation way.

For example, all the compensation parts in the display panel have the same width, and namely, the compensation parts of different lead wire parts have the same width.

For example, the respective longest compensation parts of the lead wire parts have a line length relationship as followed: H1<H2<H3<H4<H5.

For example, a method for manufacturing the lead wires WRG comprises: forming a conductive layer; forming a photoresist layer on the conductive layer; exposing and developing the photoresist layer to obtain a photoresist pattern; and etching the conductive layer using the photoresist pattern as a mask to obtain lead wires. There are the lead wires provided with compensation parts in the embodiments of the disclosure, and thus the mask can be designed according to structures of the compensation parts.

In the display panel provided in some embodiments of the disclosure, the resistance compensation of the data lines is performed in the way of the compensation parts with the constant line width and their respective line lengths changing gradually, and it is easy to manufacture the mask, which is more beneficial to the achievement of process.

Figure 16:
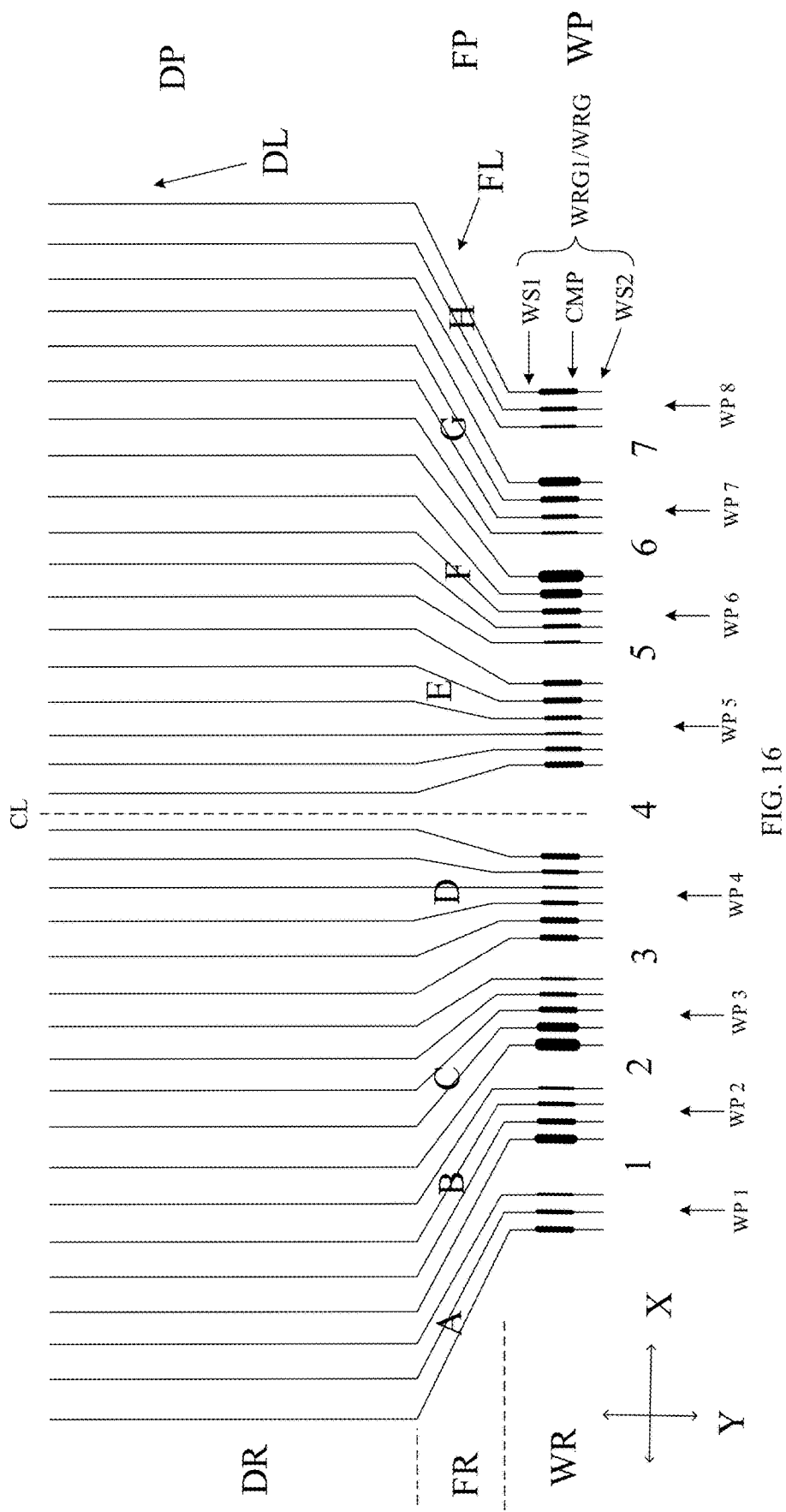
FIG. 16 is a plan view of a display panel provided in an embodiment of the disclosure.

FIG. 16 is a plan view of a display panel provided in an embodiment of the disclosure. The display panel shown in FIG. 16 differs from that shown in FIG. 6 in the compensation way of the compensation parts. In the same lead wire part in the display panel shown in FIG. 16, the compensation is performed in the way of the compensation parts with the same length and their respective widths changing gradually.

For example, as shown in FIG. 16, in the display panel, in the direction DO from the edges of the display panel to the center line CL, the plurality of compensation parts CMP of each lead wire part have their respective widths decreasing gradually, except for those of the fourth lead wire part WP4 and the fifth lead wire part WP5.

For example, in the direction DO from the edges of the display panel to the center line CL, of any one of the fourth lead wire part WP4 and the fifth lead wire part WP5, the plurality of compensation parts CMP have their respective widths decreasing gradually and then increasing gradually.

In the display panel provided in some embodiments of the disclosure, the resistance compensation is performed in the way of the compensation parts with the same line length and their respective line widths changing gradually. An introduction to the structure of the display panel will be given in the following.

1. The compensation of the data lines corresponding to the fan-out lines in the subregion A starts with the first data line from the left, with the largest compensable resistance as an initial compensation amount. The compensation part in the first lead wire part corresponding to the first data line from the left, has a line width of W1 and a line length of H1, the number of the data lines in the subregion A is n1, and a gradual change amount of line width for successive compensation is $\Delta((W1-w)/n1)$, where w is line width of data lines. The first compensation part has a line width of W1 and a line length of H1, the second compensation part has a line width of $W1-\Delta((W1-w)/n1)$ and a line length of H1, the third compensation part has a line width of $W1-2*\Delta((W1-w)/n1)$ and a line length of H1, and the k-th compensation part has a line width of $W1-(k-1)*\Delta((W1-w)/n1)$ and a line length of H1. The resistance compensation of the data lines corresponding to the subregion A can be completed by the successive compensation until the n1-th compensation part.

2. The compensation of the data lines corresponding to the fan-out lines in the subregion B starts with the first data line from the left, and the compensation resistance of the leftmost compensation part in the second lead wire part corresponding to the subregion B, has a magnitude equal to the resistance difference value R1 between the two data lines on the left and right side at the interval 1 with sudden resistance change. The compensation part corresponding to the first data line from the left, has a line width of W2 and a line length of H2, the number of the data lines corresponding to the subregion B is n2, and a gradual change amount of line length for successive compensation is $\Delta((W2-w)/n2)$, where w is line width of data lines. In the second lead wire part corresponding to the subregion B, the first compensation part from the left has a line width of W2 and a line length of H2, the second compensation part has a line width of $W-\Delta((W2-w)/n2)$ and a line length of H2, the third compensation part has a line width of $W-2*\Delta((W2-w)/n2)$ and a line length of H2, and the k-th compensation part has a line width of $W-(k-1)*\Delta((W2-w)/n2)$ and a line length of H2. The resistance compensation of the data lines corresponding to the subregion B can be completed by the successive compensation in the similar way until the n2-th compensation part.

3. The compensation of the data lines corresponding to the fan-out lines in the subregion C starts with the first data line from the left, and the compensation resistance of the leftmost compensation part in the third lead wire part corresponding to the subregion C, has a magnitude equal to the resistance difference value R2 between the data lines corresponding to the two lead wires on the left and right side at the interval 3 with sudden resistance change. The compensation part has a line width of W3 and a line length of H3, the number of the data lines corresponding to the subregion C is n3, and a gradual change amount of line width for successive compensation is $\Delta((W3-w)/n3)$, where w is line width of data lines. The first compensation part from the left in the subregion C has a line width of W3 and a line length of H3, the second compensation part has a line width of $W-\Delta((W3-w)/n3)$ and a line length of H3, the third compensation part has a line width of $W3-2*\Delta((W3-w)/n3)$ and a line length of H3, and the k-th compensation part has a line width of $W3-(k-1)*\Delta((W3-w)/n3)$ and a line length of H3. The resistance compensation of the data lines corresponding to the subregion C can be completed by the successive compensation until the n3-th compensation part.

4. The compensation of the data lines corresponding to the fan-out lines in the subregion D is performed from the data lines on the left and right side to the data line with the smallest resistance in the middle of the subregion D. The compensation resistance of the leftmost compensation part in the fourth lead wire part corresponding to the subregion D, has a magnitude equal to the resistance difference value R3 between the data lines corresponding to the two lead wires on the left and right side at the interval 3 with sudden resistance change, and the leftmost compensation part in the fourth lead wire part corresponding to the subregion D, has a line width of W4 and a line length of H4. The largest compensable resistance is used for the compensation resistance of the rightmost compensation part of the fourth lead wire part corresponding to the subregion D, as an initial compensation amount, wherein the compensation part has a line width of W5 and a line length of H5. The number of the data lines from the left side to a location with the smallest resistance in the middle corresponding to the subregion D is n4, and a gradual change amount of line width for successive compensation is $\Delta((W4-w)/n4)$, where w is line width of data lines. The first compensation part from the left in the subregion D has a line width of W4 and a line length of H4, the second compensation part has a line width of $W4-\Delta((W4-w)/n4)$ and a line length of H4, the third compensation part has a line width of $W4-2*\Delta((W4-w)/n4)$ and a line length of H4, and the k-th compensation part has a line width of $W4-(k-1)*\Delta((W4-w)/n4)$ and a line length of H4. The compensation is performed successively until the n4-th compensation part. The number of the data lines from the right side to the location with the smallest resistance in the middle corresponding to the subregion D is n5, and a gradual change amount of line width for successive compensation is $\Delta((W5-w)/n5)$, where w is line width of data lines. In the fourth lead wire part corresponding to the subregion D, the first compensation part from the right has a line width of W5 and a line length of H5, the second compensation part has a line width of $W5-\Delta((W5-w)/n5)$ and a line length of H5, the third compensation part has a line width of $W5-2*\Delta((W5-w)/n5)$ and a line length of H5, and the k-th compensation part has a line width of $W5-(k-1)*\Delta((W5-w)/n5)$ and a line length of H5. The resistance compensation of the data lines corresponding to the subregion D can be completed by the successive compensation in the similar way until the n5-th compensation part.

5. The compensation of the data lines corresponding to the fan-out lines in the subregion E: the resulting compensation parts and the compensation parts in the fourth lead wire part corresponding to the subregion D are mirror symmetrical relative to the center line of the display panel.

6. The compensation of the data lines corresponding to the fan-out lines in the subregion F: the resulting compensation parts and the compensation parts in the third lead wire part corresponding to the subregion C are mirror symmetrical relative to the center line of the display panel.

7. The compensation of the data lines corresponding to the fan-out lines in the subregion G: the resulting compensation parts and the compensation parts in the second lead wire part corresponding to the subregion B are mirror symmetrical relative to the center line of the display panel.

8. The compensation of the data lines corresponding to the fan-out lines in the subregion H: the resulting compensation parts and the compensation parts in the first lead wire part corresponding to the subregion A are mirror symmetrical relative to the center line of the display panel.

9. If the display panel comprises more subregions, the resistance compensation of fan-out lines in other subregions can be performed in the same compensation way.

For example, all the compensation parts in the display panel have the same length, and namely, the compensation parts of different lead wire parts have the same length.

For example, the plurality of compensation parts CMP have the same length in the extension direction of the first lead wires WRG1, and have their respective widths changing gradually. For example, the respective widest compensation parts of different lead wire parts have a line width relationship as followed: W1<W2<W3<W4<W5.

Figure 17:
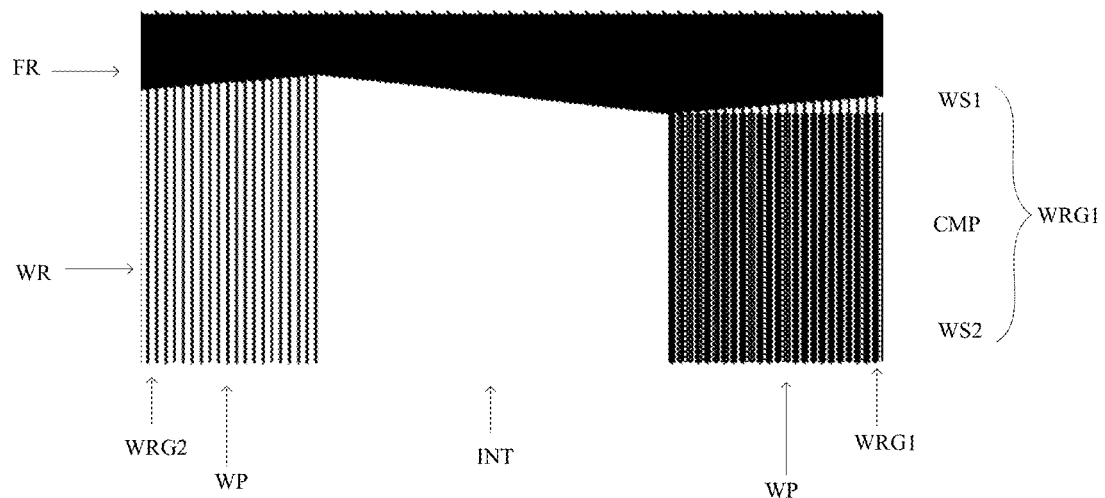
FIG. 17 is a partial plan view of a display panel provided in an embodiment of the disclosure.

FIG. 17 is a partial plan view of a display panel provided in an embodiment of the disclosure. In FIG. 17 is shown an interval INT between adjacent lead wire parts WP, which can be a plan view at any one of the interval 1, 2 and 3 in FIG. 16. As shown in FIG. 17, the lead wire part WP on the right side comprises a plurality of first lead wires WRG1. A first lead wire WRG1 comprises a first lead wire subpart WS1, a compensation part CMP and a second lead wire subpart WS2. The resistance compensation of the data lines is performed in the compensation way of the respective compensation parts of the plurality of lead wires WRG1 with their respective widths changing gradually and the same length. As shown in FIG. 17, the lead wire part WP on the left side comprises second lead wires WRG2 without the compensation part and with the same width everywhere.

Figure 18:
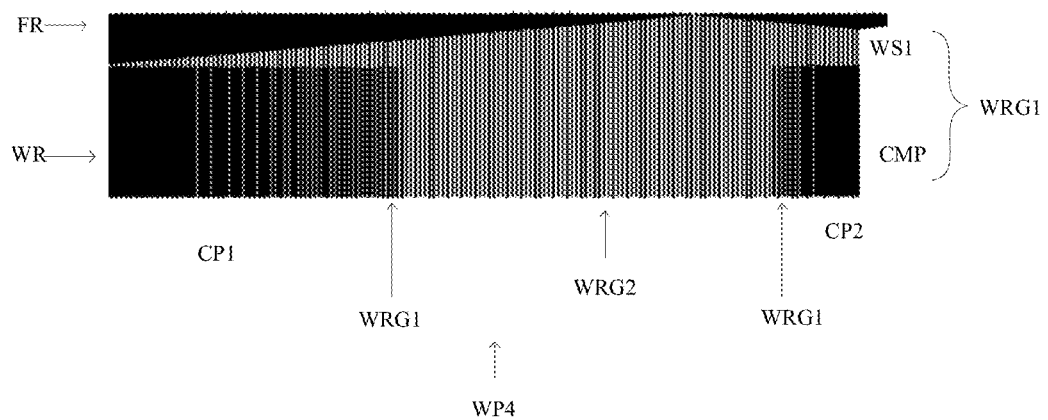
FIG. 18 is a partial plan view of a display panel provided in an embodiment of the disclosure.

FIG. 18 is a partial plan view of a display panel provided in an embodiment of the disclosure. The lead wire part shown in FIG. 18 can be the fourth lead wire part WP4 in FIG. 16. The fourth lead wire part WP4 comprises a plurality of first lead wires WRG1. A first lead wire WRG1 comprises a first lead wire subpart WS1, and a compensation part CMP. In FIG. 18 are shown two compensation units CP1 and CP2 between which there are second lead wires WRG2 with the same width everywhere. The resistance compensation of the data lines is performed in the compensation way of all the compensation parts of the compensation unit CP1 and the compensation unit CP2 with their respective widths changing gradually and the same length. The compensation parts of the compensation unit CP1 have their respective widths decreasing gradually, and the compensation parts of the compensation unit CP2 have their respective widths increasing gradually. Namely, of the fourth lead wire part WP4, the compensation parts have their respective widths which decreasing gradually and then increasing gradually along the arrangement direction of the lead wires.

In a display panel provided in some other embodiments of the disclosure, the resistance compensation is performed in the compensation way of the compensation parts with their respective line lengths changing gradually and their respective line width changing gradually. An introduction to the display panel with the structure will be given in the following.

1. The compensation of the data lines corresponding to the fan-out lines in the subregion A starts with the first data line from the left, with the largest compensable resistance as an initial compensation amount. The compensation part has a line width of W1 and a line length of H1, the number of the data lines corresponding to the subregion A is n1; a gradual change amount of line wide for successive compensation is $\Delta((W1-w)/n1)$, where w is line width of data lines; and a gradual change amount of line length is $\Delta(H1/n1)$. In the first lead wire part corresponding to the subregion A, the first compensation part has a line width of W1 and a line length of H1, the second compensation part has a line width of $W1-\Delta((W1-w)/n1)$ and a line length of $H1-\Delta(H1/n1)$, the third compensation part has a line width of $W1-2*\Delta((W1-w)/n1)$ and a line length of $H1-2*\Delta(H1/n1)$, and the k-th compensation part has a line width of $W1-(k-1)*\Delta((W1-w)/n1)$ and a line length of $H1-(k-1)*\Delta(H1/n1)$. The resistance compensation of the data lines corresponding to the subregion A can be completed by the successive compensation until the n1-th compensation part.

2. The compensation of the data lines corresponding to the fan-out lines in the subregion B starts with the first data line from the left, the compensation resistance has a magnitude equal to the resistance difference value R1 between the data lines corresponding to the two lead wires on the left and right side at the interval 1 with sudden resistance change. The compensation part has a line width of W2 and a line length of H2, the number of the data lines corresponding to the subregion B is n2, a gradual change amount of line length for successive compensation is $\Delta((W2-w)/n2)$, where w is line width of data lines, and a gradual change amount of line length is $\Delta(H2/n2)$. In the second lead wire part corresponding to the subregion B, the first compensation part from the left has a line width of W2 and a line length of H2, the second compensation part has a line width of $W-\Delta((W2-w)/n2)$ and a line length of $H2-\Delta(H2/n2)$, the third compensation part has a line width of $W-2*\Delta((W2-w)/n2)$ and a line length of $H2-2*\Delta(H2/n2)$, and the k-th compensation part has a line width of $W2-(k-1)*\Delta((W2-w)/n2)$ and a line length of $H2-(k-1)*\Delta(H2/n2)$. The resistance compensation of the data lines corresponding to the subregion B can be completed by the successive compensation in the similar way until the n2-th compensation part.

3. The compensation of the data lines corresponding to the fan-out lines in the subregion C starts with the first data line from the left, the compensation resistance has a magnitude equal to the resistance difference value R2 between the data lines corresponding to the two lead wires on the left and right side at the interval 2 with sudden resistance change. The compensation part has a line width of W3 and a line length of H3, the number of the data lines corresponding to the subregion C is n3, a gradual change amount of line width for successive compensation is $\Delta((W3-w)/n3)$, where w is line width of data lines, and a gradual change amount of line length is $\Delta(H3/n3)$. In the third lead wire part corresponding to the subregion C, the first compensation part from the left has a line width of W3 and a line length of H3, the second compensation part has a line width of $W-\Delta((W3-w)/n3)$ and a line length of $H3-\Delta(H3/n3)$, the third compensation part has a line width of $W3-2*\Delta((W3-w)/n3)$ and a line length of $H3-2*\Delta(H3/n3)$, and the k-th compensation part has a line width of $W3-(k-1)*\Delta((W3-w)/n3)$ and a line length of $H3-(k-1)*\Delta(H3/n3)$. The resistance compensation of the data lines corresponding to the subregion C can be completed by the successively compensation in the similar way until the n3-th compensation part.

4. The compensation of the data lines corresponding to the fan-out lines in the subregion D is performed from the data lines on the left and right side to the data line with the smallest resistance in the middle of the subregion D. The compensation resistance of the data line corresponding to the left side of the subregion D, has a magnitude equal to the resistance difference value R3 between the data lines corresponding to the two lead wires on the left and right side at the interval 3 with sudden resistance change, and the compensation part of the data line has a line width of W4 and a line length of H4. The largest compensable resistance is used for the compensation resistance of the data line corresponding to the right side of the subregion D, as an initial compensation amount, and the compensation part has a line width of W5 and a line length of H5. The number of the data lines from the left side to a location with the smallest resistance in the middle corresponding to the subregion D is n4, a gradual change amount of line width for successive compensation is $\Delta((W4-w)/n4)$, where w is line width of data lines, and a gradual change amount of line length is $\Delta(H4/n4)$. In the fourth lead wire part corresponding to the subregion D, the first compensation part from the left has a line width of W4 and a line length of H4, the second compensation part has a line width of $W4-\Delta((W4-w)/n4)$ and a line length of $H4-\Delta(H4/n4)$, the third compensation part has a line width of $W4-2*\Delta((W4-w)/n4)$ and a line length of $H4-2*\Delta(H4/n4)$, and the k-th compensation part has a line width of $W4-(k-1)*\Delta((W4-w)/n4)$ and a line length of $H4-(k-1)*\Delta(H4/n4)$. The compensation is performed successively in the similar way until the n4-th compensation part. The number of the data lines from the right side to the location with the smallest resistance in the middle corresponding to the subregion D is n5, a gradual change amount of line width for successive compensation is $\Delta((W5-w)/n5)$, where w is line width of data lines, and a gradual change amount of line length is $\Delta(H5/n5)$. In the fourth lead wire part corresponding to the subregion D, the first compensation part from the right has a line width of W5 and a line length of H5, the second compensation part has a line width of $W5-\Delta((W5-w)/n5)$ and a line length of $H5-\Delta(H5/n5)$, the third compensation part has a line width of $W5-2*\Delta((W5-w)/n5)$ and a line length of $H5-2*\Delta(H5/n5)$, and the k-th compensation part has a line width of $W5-(k-1)*\Delta((W5-w)/n5)$ and a line length of $H5-(k-1)*\Delta(H5/n5)$. The resistance compensation of the data lines corresponding to the subregion D can be completed by the successive compensation in the similar way until the n5-th compensation part.

5. The compensation of the data lines corresponding to the fan-out lines in the subregion E: the resulting compensation parts and the compensation parts in the fourth lead wire part corresponding to the subregion D are mirror symmetrical relative to the center line of the display panel.

6. The compensation of the data lines corresponding to the fan-out lines in the subregion F: the resulting compensation parts and the compensation parts in the third lead wire part corresponding to the subregion C are mirror symmetrical relative to the center line of the display panel.

7. The compensation of the data lines corresponding to the fan-out lines in the subregion G: the resulting compensation parts and the compensation parts in the second lead wire part corresponding to the subregion B are mirror symmetrical relative to the center line of the display panel.

8. The compensation of the data lines corresponding to the fan-out lines in the subregion H: the resulting compensation parts and the compensation parts in the first lead wire part corresponding to the subregion A are mirror symmetrical relative to the center line of the display panel.

9. If the display panel comprises more subregions, the resistance compensation of fan-out lines in other subregions can be performed in the same compensation way.

Figure 19:
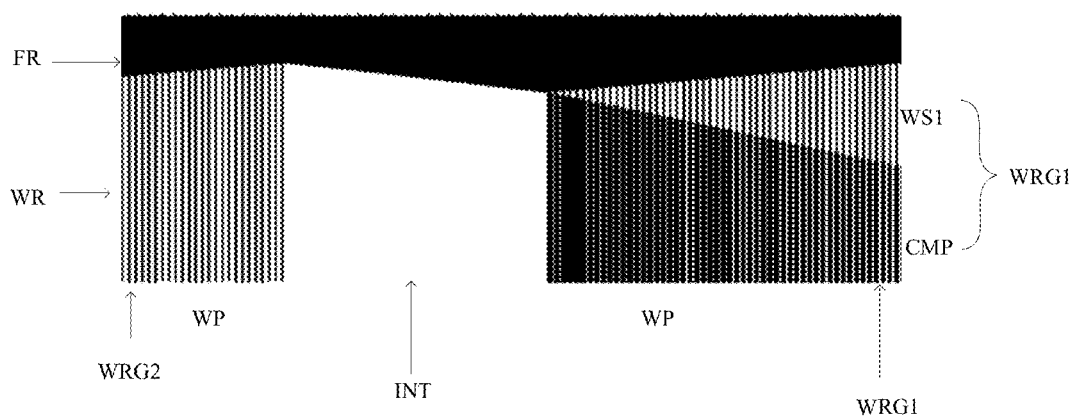
FIG. 19 is a partial plan view of a display panel provided in an embodiment of the disclosure.

FIG. 19 is a partial plan view of a display panel provided in an embodiment of the disclosure. In FIG. 19 is shown an interval INT between adjacent lead wire parts WP, which can be a plan view at any one of the interval 1, 2 and 3 in FIG. 6 or FIG. 16, and of course, the compensation part has a different structure from those in FIG. 6 and FIG. 16. As shown in FIG. 19, the lead wire part WP on the right side comprises a plurality of first lead wires WRG1. A first lead wire WRG1 comprises a first lead wire subpart WS1, a compensation part CMP and a second lead wire subpart WS2. The resistance compensation of the data lines is performed in the compensation way of the respective compensation parts of the plurality of lead wires WRG1 with their respective widths changing gradually and their respective lengths changing gradually. As shown in FIG. 19, in a direction from left to right, the compensation parts have their respective widths decreasing gradually and their respective lengths decreasing gradually. As shown in FIG. 19, the lead wire part WP on the left side comprises second lead wires WRG2 without the compensation part and with the same width everywhere.

Figure 20:
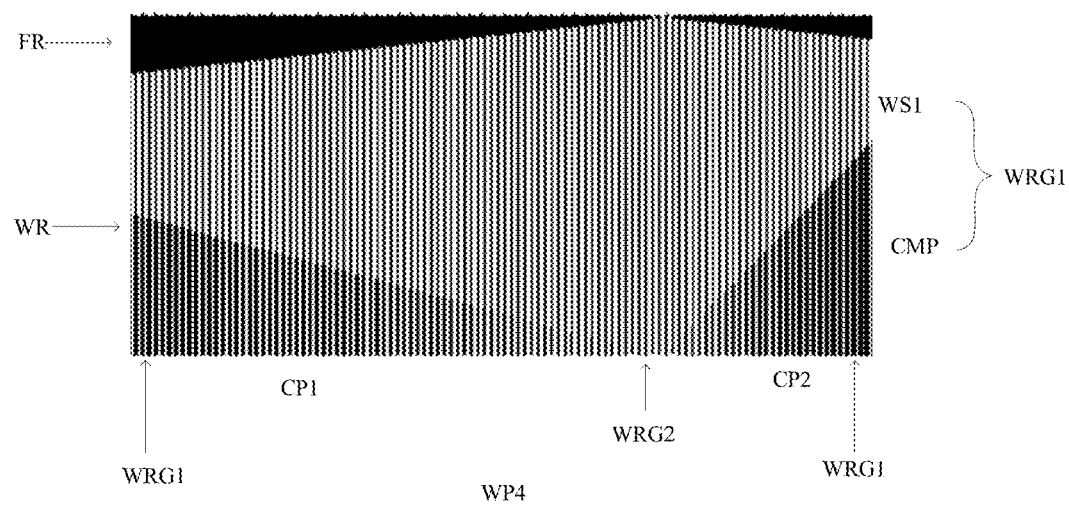
FIG. 20 is a partial plan view of a display panel provided in an embodiment of the disclosure.

FIG. 20 is a partial plan view of a display panel provided in an embodiment of the disclosure. The lead wire part shown in FIG. 20 can be the fourth lead wire part WP4 in FIG. 6 or FIG. 16, and of course, its compensation parts have a different compensation way from those in FIG. 6 and FIG. 16. The fourth lead wire part WP4 comprises a plurality of first lead wires WRG1. A first lead wire WRG1 comprises a first lead wire subpart WS1, and a compensation part CMP. In FIG. 20 are shown two compensation units CP1 and CP2. The resistance compensation of the data lines is performed in the compensation way of all the compensation parts of the compensation unit CP1 and the compensation unit CP2 with their respective widths changing gradually and their respective lengths changing gradually. As shown in FIG. 20, there are second lead wires WRG2 with the same width everywhere, between the compensation unit CP1 and the compensation unit CP2. The compensation parts of the compensation unit CP1 have their respective lengths decreasing gradually and their respective widths decreasing gradually, and the compensation parts of the compensation unit CP2 have their respective widths increasing gradually and their respective lengths increasing gradually. Namely, in the fourth lead wire part WP4, the compensation parts have their respective widths decreasing gradually and then increasing gradually and their respective lengths decreasing gradually and then increasing gradually.

The lead wires in the fan-out region in the embodiments of the disclosure can be arranged symmetrically relative to the center line CL. The lead wires WRG in the embodiments of the disclosure all can be the first lead wire WRG1 without inclusion of the second lead wire WRG2, and namely the resistance compensation of every data line is performed, to which the disclosure is not limited. In some embodiments, the lead wires WRG comprise first lead wires WRG1 and second lead wires WRG2.

Figure 21:
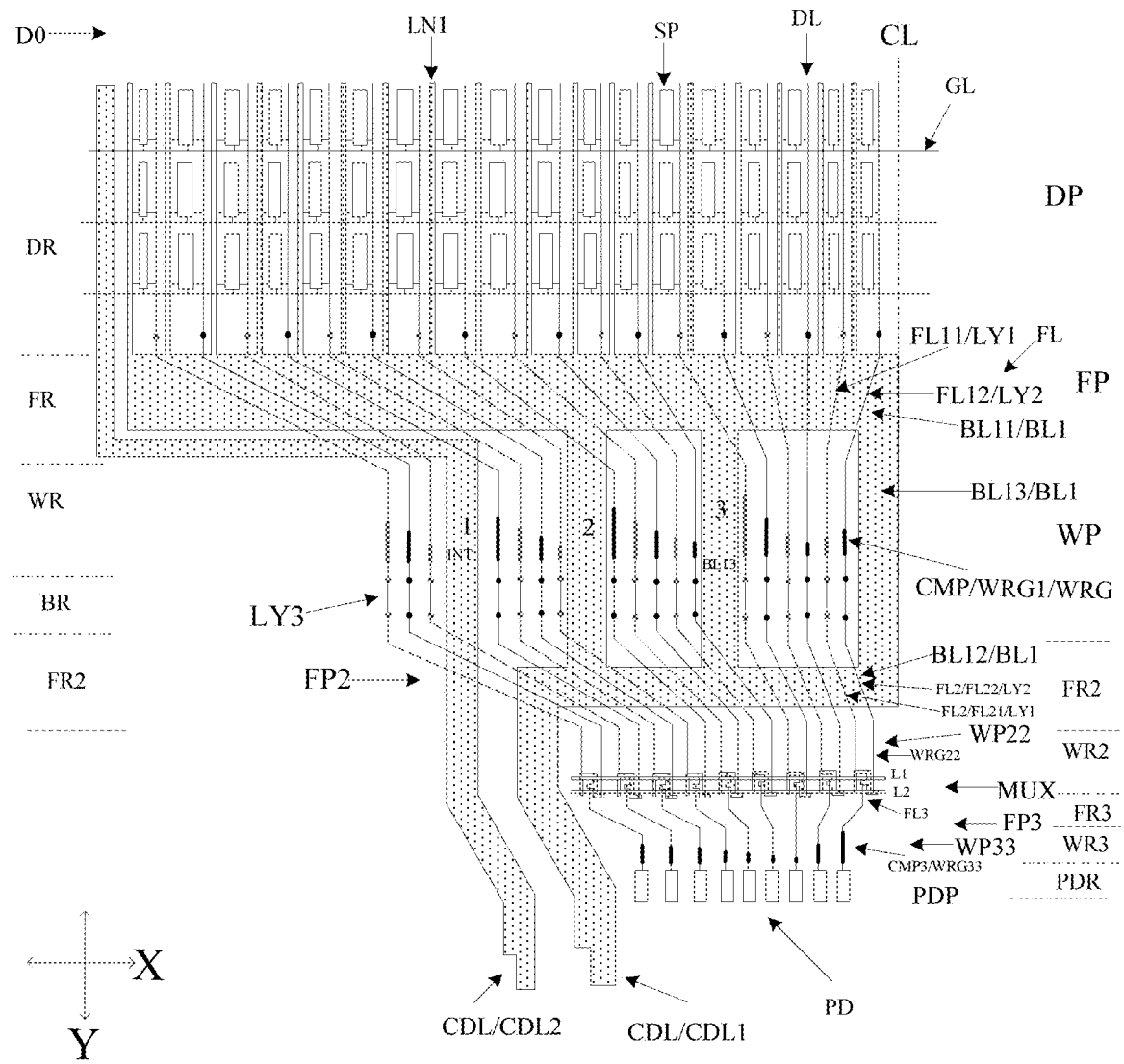
FIG. 21 is a partial plan view of a display panel provided in an embodiment of the disclosure.

FIG. 21 is a partial plan view of a display panel provided in an embodiment of the disclosure. In FIG. 21 is shown only the left lower part of the display panel relative to the center line CL, the right part and the left part of the display panel are arranged symmetrically relative to the center line CL. For clear illustration, the display region and all parts therein are not shown. In the display panel shown in FIG. 21 are shown a connection pad region PDR and a connection pad part PDP therein, with every connection pad PD connected with at least one fan-out line. In FIG. 21 is further shown a bending region BR and a fan-out region FR2 on a side of the bending region BR away from a lead wire region WR. The fan-out region FR2 can also be referred as a second fan-out region, and accordingly, the fan-out region FR can be referred as a first fan-out region. There are fan-out lines FL2 arranged in the fan-out region FR2. A plurality of fan-out lines FL2 are respectively connected with a plurality of fan-out lines FL in the fan-out region FR, and are in turn connected to the data lines in the display region.

As shown in FIG. 21, the connection pads PD are configured to be bounded with pins of an integrated circuit. Referring to FIG. 21, between the fan-out region FR2 and the connection pad region FDR are further arranged other units, such as test units which are not shown in FIG. 21 for clear illustration.

As shown in FIG. 21, the fan-out lines FL are connected through a data selection unit MUX, with a fan-out region FR3 which can also be referred as a third fan-out region. The fan-out region FR3 comprises a plurality of fan-out lines FL3 which are respectively connected with a plurality of connection pads PD. As shown in FIG. 21, the plurality of fan-out lines FL3 are respectively connected with the plurality of connection pads PD through a plurality of lead wires WRG33. For example, for the resistance compensation of the data lines, the plurality of lead wires WRG33 can also be provided with compensation parts CMP3. The provision of the plurality of lead wires with the compensation parts CMP3 is taken as an example to explain in FIG. 21. The arrangement of the compensation parts CMP1 can be referred for that of the compensation parts CMP3 which is not described herein.

As shown in FIG. 21, every connection pad PD is respectively connected with two lead wires WRG through a multiplexer MUX, and is in turn electrically connected respectively with two data lines. For example, after reaching the multiplexer MUX, data signals are respectively transmitted to two data lines DL connected with the multiplexer MUX by the respective control of a first signal line L1 and a second signal line L2 to open in different time intervals. Conventional design can be referred for the arrangement of the multiplexer MUX. The multiplexer is not limited to be connected with two data lines, and the number of data lines DL with which the multiplexer MUX is connected can be determined as needed.

As shown in FIG. 21, the display panel further comprises conducting wires CDL which, for example, are used to be bound with a flexible circuit board. As shown in FIG. 21, the conducting wires CDL comprise a first power signal line CDL1 and a second power signal line CDL2. The first power signal line CDL1 is configured to provide the subpixels with a first power voltage, and the second power signal line CDL2 is configured to provide the subpixels with a second power voltage. For example, the first power signal line CDL1 is VDD line, and the second power signal line CDL2 is VSS line. For example, the second power signal line CDL2 is connected a cathode of a light emitting diode. Gate lines GL are further shown in FIG. 21. The gate lines GL extend along the X direction. A plurality of gate lines GL and the plurality of data lines DL are insulated from each other, and are crossed with each other to define a plurality of subpixels SP.

For example, as shown in FIG. 21, an interval INT at a location 1 has a size of about 1800 μm in the X direction, to which the disclosure is not limited. An interval INT at a location 2 has a size of about 1800 μm in the X direction, to which the disclosure is not limited. An interval INT at a location 3 has a size of about 1800 μm in the X direction, to which the disclosure is not limited.

For example, as shown in FIG. 21, in the display panel, the fan-out lines FL comprise first fan-out lines FL11 and second fan-out lines FL12 which are arranged adjacently, with the first fan-out lines FL11 located on a first layer LY1 and the second fan-out lines FL12 located on a second layer LY2. For example, a plurality of first fan-out lines FL11 and a plurality of second fan-out lines FL12 are arranged alternately. For example, a plurality fan-out lines FL comprise the plurality of first fan-out lines FL11 and the plurality of second fan-out lines FL12 which are arranged alternately and are located on different layers.

As shown in FIG. 21, the plurality of first lead wires WRG1 comprise a plurality of first lead wires of first type and a plurality of first lead wires of second type. The plurality of first lead wires of first type are respectively connected with the plurality of first fan-out lines FL11 and are located on the same layer as the ones. The plurality of first lead wires of second type are respectively connected with the plurality of second fan-out lines FL12 and are located on the same layer as the ones.

For example, as shown in FIG. 21, the display panel comprises a fan-out part FP2, and fan-out lines FL2 comprises first fan-out lines FL21 and second fan-out lines FL22 which are arranged adjacently, with the first fan-out lines FL21 located on the first layer LY1 and the second fan-out lines FL22 located on the second layer LY2. For example, a plurality of first fan-out lines FL21 and a plurality of second fan-out lines FL22 are arranged alternately.

For example, as shown in FIG. 21, the first power signal line CDL1 is located on a third layer LY3, and the second power signal line CDL2 is located on a third layer LY3. For example, the second power signal line CDL2 can be connected with the cathode of the light emitting diode through an adapter element arranged on the same layer as an anode of the light emitting diode. The anode of the light emitting diode and the adapter element are formed by the same film layer in the same patterning process and are spaced apart from each other.

When the display panel comprises second lead wires WRG2, the second lead wires WRG2 are also located on the third layer LY3. The first layer LY1 is formed by the same film layer in the same patterning process, the second layer LY2 is formed by the same film layer in the same patterning process, and the third layer LY3 is formed by the same film layer in the same patterning process. For example, the first layer LY1 is a first gate layer, the second layer LY2 is a second gate layer, and the third layer LY3 is a source drain layer. For example, the first layer LY1 further comprises the gate lines located in the display region, the second layer LY2 further comprises initial signal lines located in the display region, and the third layer LY3 further comprises source electrodes and drain electrodes located in the display region. The gate lines are configured to provide the subpixels with scan signals, and the initialized signal lines are configured to provide the subpixels with initialized signals.

For example, as shown in FIG. 21, both gray dots and black dots represent the connection of two sublines through a via hole, with the two sublines located on different layers. Because the same line is formed by connecting sublines on different layer through a via hole or has different portions located on different layers, the second power signal line CDL2 is not connected with a line crossed with it shown in FIG. 21, and the first power signal line CDL1 is not connected with a line crossed with it shown in FIG. 21. Therefore, signals can be respectively transmitted to the data lines in the display region through the integrated circuit bound with the connection pads PD, and signals can be respectively transmitted to the conducting wires CDL through the flexible circuit board bound with the conducting wires CDL.

For example, as shown in FIG. 21, in some embodiments, the base substrate is a flexible substrate, and thus the bending region BR is arranged, to which the disclosure is not limited. Lead wires in the bending region BR are made of conducting materials forming the third layer LY3.

For example, the first layer LY1, the second layer LY2 and the third layer LY3 all are made of conducting materials which, for example, comprise at least one of metal or alloy. Materials forming the first layer LY1 and the second layer LY2 comprise nickel, to which the disclosure is not limited. For example, metals forming the third layer LY3 comprise Ti—Al—Ti and have good bending resistance.

For example, as shown in FIG. 21, the first power signal line CDL1 comprises a first power bus BL1 which is located on a side of the display part DP and at least partly overlaps with a plurality of fan-out lines. The first power bus BL1 comprises a first portion BL11, a second portion BL12 and a connection line BL13 connecting the first portion BL11 and the second portion BL12. The connection line BL13 overlaps with an interval INT, and namely the connection line BL13 is located within the interval INT.

For example, as shown in FIG. 21, the first portion BL11 extends along the X direction, the second portion BL12 extends along the X direction, and the connection line BL13 extends along the Y direction. For example, the first portion BL11 is parallel to the second portion BL12 and is perpendicular to the connection line BL13.

For example, as shown in FIG. 21, the second portion BL12 of the first power bus BL1 is located on a side of the first portion BL11 of the first power bus BL1 away from the display part DP.

For example, the first power signal line CDL1 further comprises a plurality of first power lines LN1 extending from the first power bus BL1 to the display part DP, which are configured to provide a plurality of subpixels SP with first power signals. For example, a first power signal comprises a first power voltage.

For example, at least a part of the second power signal line CDL2 overlaps with an interval INT, and is configured to provide the plurality of subpixels SP with second power signals. For example, a second power signal comprises a second power voltage less than the first power voltage. For example, the second power signal line CDL2 can surround the display part DP and has an opening at its bottom.

Three rows of subpixels are shown in FIG. 21, the number of subpixels included in the display panel is not limited to this and can be determined as needed.

In FIG. 21 are shown a fan-out region FR2, a lead wire region WR2, a fan-out region FR3 and a lead wire region WR33. Fan-out parts FP2 are located in the fan-out region FR2 and comprise a plurality of fan-out lines FL2. Fan-out part FP3 are located in the fan-out region FR3 and comprise a plurality of fan-out lines FL3. Lead wire parts WP22 are located in the lead wire region WR2 and comprise a plurality of lead wires WRG22. Lead wire parts WP33 are located in the lead wire region WR3 and comprise a plurality of lead wires WRG33. The plurality of lead wires WRG22 can also be arranged with compensation parts, for the arrangement way of which the arrangement way of compensation parts in any lead wire part can be referred. The lead wires WRG22 can be located on the same layer as the fan-out lines FL2 connected with them, and namely the plurality of lead wires WRG22 comprise a plurality of lead wires located on the first layer and a plurality of lead wires located on the second layer.

In FIG. 21, a portion above the fan-out lines FL is referred as data lines DL, and namely, in FIG. 21, the portion above the fan-out lines FL connected with the fan-out lines FL and extending along the Y direction, is data lines DL. For example, the data lines DL comprise a portion located on the third layer Y3 and a portion located on the first layer LY1 or LY2, to which the disclosure is not limited.

Figure 22:
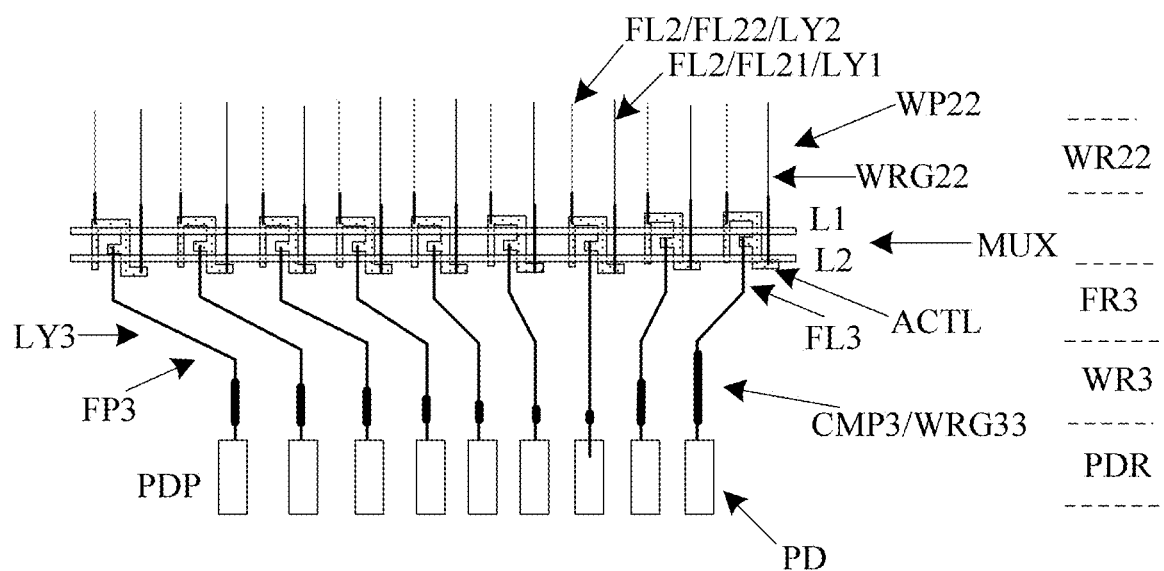
FIG. 22 is an enlarged schematic diagram of a multiplexer in FIG. 21.

FIG. 22 is an enlarged schematic diagram of a multiplexer in FIG. 21. Referring to FIG. 21 and FIG. 22, each multiplexer MUX comprises an active layer ACTL, a portion of the active layer ACTL covered by the first signal line L1 and the second signal line L2 is a channel region, and a portion of the active layer ACTL not covered by the first signal line L1 and the second signal line L2 is conductors. A first end of the active layer ACTL is connected with one data line DL, a second end of the active layer ACTL is connected with another data line DL, and a third end of the active layer ACTL is connected with connection pads PD through lead wires WRG33. The first, second and third end of the active layer ACTL all are located on the conductor portion of the active layer ACTL, and are connected with the active layer ACTL through adapters located on the third layer. The fan-out lines FL3 can be located on the first layer LY1, can also be located on the second layer LY2 or comprise portions located on the first layer LY1 and portions located on the second layer LY2. The fan-out lines FL3 can also be located on the third layer LY3. The fan-out lines FL3 connected with lead wires WRG33 can be referred for the lead wires WRG33.

Figure 23:
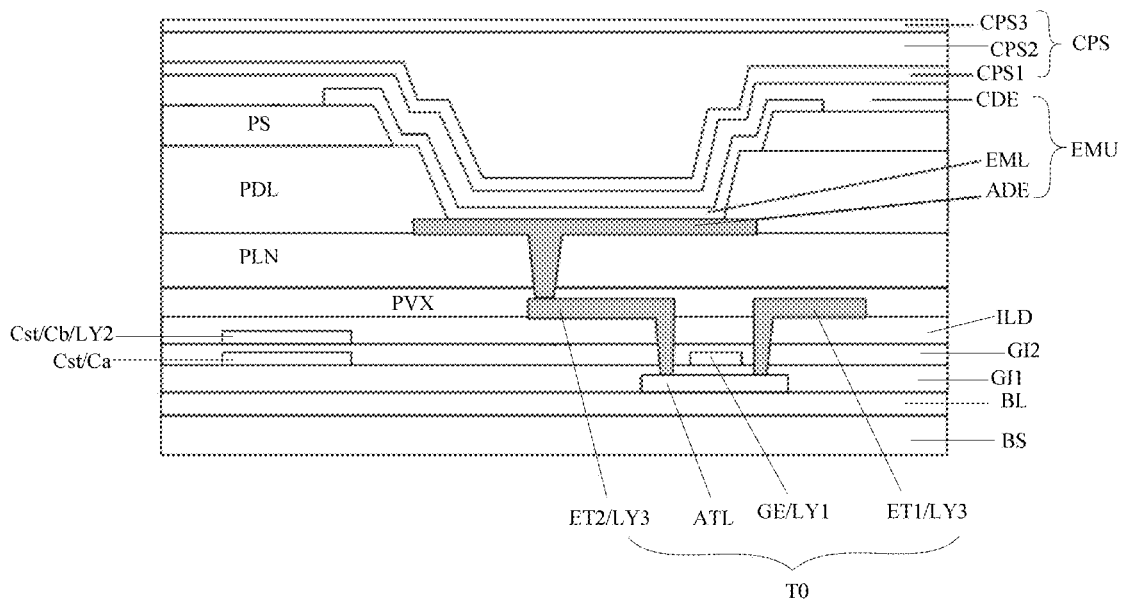
FIG. 23 is a sectional view of a display panel provided in an embodiment of the disclosure.

FIG. 23 is a sectional view of a display panel provided in an embodiment of the disclosure. For example, as shown in FIG. 23, at least one of a plurality of subpixels SP comprises a thin film transistor T0 and a storage capacitor Cst. The thin film transistor T0 is a data write transistor. The thin film transistor T0 comprises an active layer ATL located on the base substrate BS, a first gate insulation layer Gll located on a side of the active layer ATL away from the base substrate BS, a gate electrode GE located on a side of the first gate insulation layer Gll away from the base substrate BS, a second gate insulation layer GI2 located on a side of the gate electrode GE away from the base substrate BS, an interlayer insulation layer ILD located on a side of the second gate insulation layer GI2 away from the base substrate BS, and a first electrode ET1 and a second electrode ET2 located on a side of the interlayer insulation layer ILD away from the base substrate BS. The storage capacitor Cst comprises a first electrode plate Ca and a second electrode plate Cb. The first electrode plate Ca is located on the same layer as the gate electrode GE, and they both are located on the first layer LY1. The second electrode plate Cb is located between the second gate insulation layer GI2 and the interlayer insulation layer ILD, and is located on the second layer LY2. Referring to FIG. 21 and FIG. 23, a plurality of first fan-out lines FL11, the gate electrode GE and the first electrode plate Ca are located on the same layer and all are located on the first layer LY1. A plurality of second fan-out lines FL12 and the second electrode plate Cb are located on the same layer and both are located on the second layer LY2. One of the first electrode ET1 and the second electrode ET2 is a source electrode, and the other is a drain electrode. Referring to FIG. 21 and FIG. 23, the first electrode ET1, the second electrode ET2, and the lead wires WRG are located on the third layer LY3. The display panel further comprises a passivation layer PVX and a planarization layer PLN. Where the display panel comprises the bending region, the lead wires located on the bending region are located on the third layer LY3.

As shown in FIG. 23, the display panel further comprises a light-emitting unit EMU which comprises an anode ADE, a light-emitting functional layer EML and a cathode CDE. The anode ADE is connected with the second electrode ET2 by passing through via holes in the passivation layer PVX and the planarization layer PLN. The first electrode ET1 is connected with the data lines, and for example, is integrated with the data lines. The display panel further comprises an encapsulation layer CPS which comprises a first encapsulation layer CPS1, a second encapsulation layer CPS2 and a third encapsulation layer CPS3. For example, the first encapsulation layer CPS1 and the third encapsulation layer CPS3 are an inorganic material layer, and the second encapsulation layer CPS2 is an organic material layer.

As shown in FIG. 23, the display further comprises a pixel definition layer PDL and a spacer PS. The pixel definition layer PDL is configured to define openings of the subpixels, and the spacer PS is configured to support a fine metal mask when the light-emitting functional layer EML is formed.

For example, one of the anode and the cathode of the light-emitting unit EMU is electrically connected with a drive transistor which is configured to provide the light-emitting unit EMU with drive current driving the light-emitting unit EMU to emit light.

The data lines are configured to input data signals to the subpixels. The first power signal line is configured to input the first power voltage to the drive transistor, and the second power signal line is configured to input the second power voltage to the subpixels. The first power voltage is constant voltage, and the second power voltage is constant voltage; for example, the first power voltage is positive voltage, and the second power voltage is negative voltage, to which the disclosure is not limited. For example, in some embodiments, the first power voltage is positive voltage, and the second power signal line is grounded.

In some embodiments, the display panel can further comprise other transistor(s) such as light-emitting control transistor and reset transistor, in addition to the drive transistor and the data write transistor. For example, a pixel circuit of the display panel can be a 7T1C (namely, seven transistors and one capacitor) structure, and can also be a structure including other number of transistors, such as 7T2C structure, 6T1C structure, 6T2C structure or 9T2C structure, which is not limited in the embodiments of the disclosure.

It is necessary to explain that the transistors used in the embodiments of the disclosure can be a thin film transistor, a field effect transistor or other switching element with the same characteristics. The thin film transistor can comprise an oxide semiconductor thin film transistor, an amorphous silicon thin film transistor or a polysilicon thin film transistor, etc. The source electrode and drain electrode of the transistor can be symmetrical in structure, and thus there is no difference between its source electrode and drain electrode in physical structure. In the embodiments of the disclosure, in order to distinguish the transistors, except for the gate electrode as a control electrode, it is directly described that one of the electrodes is the first electrode and the other is the second electrode. Thus, all or a part of the transistors in the embodiments of the disclosure have the first electrode and the second electrode which are interchangeable as needed.

In the embodiments of the disclosure is further provided a display device comprising any one of the above display panels. For example, the display device comprises an OLED display device, to which the disclosure is not limited. The display device further comprises a liquid crystal display device.

For example, the display device comprises the OLED display device or the liquid crystal display device; or comprises any product or component with display function, such as a computer, mobile phone, watch, electronic picture frame and navigator of these devices.

The above are only the specific embodiments of the disclosure, but the protection scope of the disclosure is not limited thereto. Those skilled in the art can easily conceive changes or substitutions within the technical scope disclosed in this disclosure, which should be covered within the protection scope of the disclosure. Therefore, the protection scope of the disclosure shall be subject to the protection scope of the appended claims.

The invention claimed is:

1. A display panel, comprising:
   a display part comprising a plurality of data lines and a plurality of subpixels, the plurality of data lines being electrically connected with the plurality of subpixels and being configured to provide the plurality of subpixels with data signals;
   a fan-out part comprising a plurality of fan-out lines, at least a part of which have an extension direction different from that of the data lines; and
   a lead wire part comprising a plurality of first lead wires which are respectively connected with the plurality of data lines through the plurality of fan-out lines, the plurality of fan-out lines being fanned out between the lead wire part and the display part, the first lead wires having an extension direction the same as that of the data lines, and adjacent data lines of the plurality of data lines having a distance greater than that between adjacent first lead wires of the plurality of first lead wires;
   wherein the plurality of first lead wires each comprise a first lead wire subpart and a compensation part to form a plurality of first lead wire subparts and a plurality of compensation parts, the plurality of first lead wire subparts are respectively connected with the plurality of compensation parts; in a plan view of the display panel, the first lead subparts have a width different from that of the compensation parts in a direction perpendicular to the extension direction of the first lead wires,
   wherein the first lead wires further comprise second lead wire subparts connected with the compensation parts, and the second lead wire subparts have a width smaller than that of the compensation parts and are located on a side of the compensation parts away from the display part.

2. The display panel according to claim 1, wherein an included angle between at least one of the plurality of data lines and at least one of the plurality of fan-out lines is an obtuse angle.

3. The display panel according to claim 1, wherein the first lead wire subparts are closer to the fan-out part than the compensation parts, and the first lead wire subparts have a width smaller than that of the compensation parts.

4. The display panel according to claim 1, wherein adjacent compensation parts have the same width.

5. The display panel according to claim 1, wherein adjacent compensation parts have different lengths in the extension direction of the first lead wires.

6. The display panel according to claim 1, wherein the plurality of compensation parts change linearly, the plurality of compensation parts have their respective lengths changing gradually in an arrangement direction of the plurality of first lead wires,
   wherein a number of the plurality of first lead wires is n, the longest compensation part of the plurality of compensation parts has a length of H, and the plurality of compensation parts have a gradual change amount of length of $\Delta(H/n)$.

7. The display panel according to claim 1, wherein the display panel has a center line which has an extension direction the same as that of the first lead wires, and the plurality of compensation parts have their respective lengths decreasing gradually in a direction from edges of the display panel to the center line.

8. The display panel according to claim 7, wherein a plurality of lead wire parts are provided, which are arranged symmetrically relative to the center line of the display panel.

9. The display panel according to claim 8, wherein the plurality of lead wire parts comprise a first lead wire part and a second lead wire part, and a plurality of compensation parts of the first lead wire part have a total area different from that of a plurality of compensation parts of the second lead wire part.

10. The display panel according to claim 8, wherein the lead wire parts have their respective total areas of compensation parts increasing gradually in the direction from the edges of the display panel to the center line; or, the plurality of compensation parts of the lead wire part close to the center line have a larger total area than the plurality of compensation parts of the lead wire part away from the center line, in the direction from the edges of the display panel to the center line.

11. The display panel according to claim 8, wherein between adjacent lead wire parts there is an interval whose width is larger than a distance between adjacent first lead wires of the respective lead wire parts.

12. The display panel according to claim 1, wherein the display panel has a center line which has an extension direction the same as that of the first lead wires, a plurality of lead wire parts are provided, the plurality of lead wire parts comprise two lead wire parts that are immediate adjacent to the center line and are located at two sides of the center line, and in each of the two lead wire parts that are immediately adjacent to the center line and are located at two sides of the center line, the plurality of compensation parts have their respective lengths decreasing gradually and then increasing gradually in a direction from edges of the display panel to the center line.

13. The display panel according to claim 12, wherein in each of the plurality of lead wire parts other than the two lead wire parts that are immediate adjacent to the center line and are located at two sides of the center line, the plurality of compensation parts have their respective lengths decreasing gradually in a direction from edges of the display panel to the center line.

14. The display panel according to claim 1, wherein the plurality of compensation parts have the same length in the extension direction of the first lead wires, and have their respective widths changing gradually; or, the plurality of compensation parts have their respective lengths in the extension direction of the first lead wires changing gradually, and have their respective widths changing gradually.

15. The display panel according to claim 1, further comprising a connection pad part which is configured to be connected with an external circuit, wherein the connection pad part comprises a plurality of connection pads and is located on a side of the lead wire part away from the fan-out part, and the plurality of connection pads are electrically connected with the plurality of first lead wires.

16. The display panel according to claim 1, wherein the plurality of fan-out lines comprise a plurality of first fan-out lines and a plurality of second fan-out lines arranged alternately, which are located on different layers; the plurality of first lead wires comprise a plurality of first lead wires of first type and a plurality of first lead wires of second type arranged alternately; the plurality of first lead wires of first type are respectively connected with the plurality of first fan-out lines and are located on the same layer as the plurality of first fan-out lines; and the plurality of first lead wires of second type are respectively connected with the plurality of second fan-out lines and are located on the same layer as the plurality of second fan-out lines.

17. The display panel according to claim 16, wherein at least one of the plurality of subpixels comprises a thin film transistor and a storage capacitor;

the thin film transistor comprises an active layer located on a base substrate, a first gate insulation layer located on a side of the active layer away from the base substrate, a gate electrode located on a side of the first gate insulation layer away from the base substrate, a second gate insulation layer located on a side of the gate electrode away from the base substrate, an interlayer insulation layer located on a side of the second gate insulation layer away from the base substrate, and a source electrode and a drain electrode located on a side of the interlayer insulation layer away from the base substrate;

the storage capacitor comprises a first electrode plate and a second electrode plate, the first electrode plate is located on the same layer as the gate electrode, and the second electrode plate is located between the second gate insulation layer and the interlayer insulation layer; and the plurality of first fan-out lines, the plurality of first lead wires of first type, the gate electrode and the first electrode plate all are located on the same layer, and the plurality of second fan-out lines, the plurality of first lead wires of second type and the second electrode plate are located on the same layer.

18. A display panel, comprising:

a display part comprising a plurality of data lines and a plurality of subpixels, the plurality of data lines being electrically connected with the plurality of subpixels and being configured to provide the plurality of subpixels with data signals;

a fan-out part comprising a plurality of fan-out lines, at least a part of which have an extension direction different from that of the data lines; and a lead wire part comprising a plurality of first lead wires which are respectively connected with the plurality of data lines through the plurality of fan-out lines, the plurality of fan-out lines being fanned out between the lead wire part and the display part, the first lead wires having an extension direction the same as that of the data lines, and adjacent data lines of the plurality of data lines having a distance greater than that between adjacent first lead wires of the plurality of first lead wires;

wherein the plurality of first lead wires each comprise a first lead wire subpart and a compensation part to form a plurality of first lead wire subparts and a plurality of compensation parts, the plurality of first lead wire subparts are respectively connected with the plurality of compensation parts; in a plan view of the display panel, the first lead subparts have a width different from that of the compensation parts in a direction perpendicular to the extension direction of the first lead wires, the display panel further comprises a plurality of second lead wires which have the same width everywhere.

19. A display panel, comprising:

a display part comprising a plurality of data lines and a plurality of subpixels, the plurality of data lines being electrically connected with the plurality of subpixels and being configured to provide the plurality of subpixels with data signals;

a fan-out part comprising a plurality of fan-out lines, at least a part of which have an extension direction different from that of the data lines; and a lead wire part comprising a plurality of first lead wires which are respectively connected with the plurality of data lines through the plurality of fan-out lines, the plurality of fan-out lines being fanned out between the lead wire part and the display part, the first lead wires having an extension direction the same as that of the data lines, and adjacent data lines of the plurality of data lines having a distance greater than that between adjacent first lead wires of the plurality of first lead wires;

wherein the plurality of first lead wires each comprise a first lead wire subpart and a compensation part to form a plurality of first lead wire subparts and a plurality of compensation parts, the plurality of first lead wire subparts are respectively connected with the plurality of compensation parts; in a plan view of the display panel, the first lead subparts have a width different from that of the compensation parts in a direction perpendicular to the extension direction of the first lead wires, wherein the display panel has a center line which has an extension direction the same as that of the first lead wires, and the plurality of compensation parts have their respective lengths decreasing gradually in a direction from edges of the display panel to the center line, wherein a plurality of lead wire parts are provided, which are arranged symmetrically relative to the center line of the display panel, wherein between adjacent lead wire parts there is an interval whose width is larger than a distance between adjacent first lead wires of the respective lead wire parts, the display panel further comprises a first power bus which is located on a side of the display part and at least partly overlaps with the plurality of fan-out lines, and a plurality of first power lines extending from the first power bus, wherein the first power bus comprises a first portion, a second portion and a connection line, the connection line connects the first portion and the second portion and overlaps with the interval, wherein the second portion of the first power bus is located on a side of the first portion of the first power bus away from the display part, and wherein the plurality of first power lines extend to the display part and are configured to provide the plurality of subpixels with first power signals.

20. The display panel according to claim 11, further comprising a second power signal line surrounding the display part, wherein at least a part of the second power signal line overlaps with the interval, and the second power signal line is configured to provide the plurality of subpixels with second power signals.

* * * * *